US008928044B2

(12) United States Patent
Ozeki et al.

(10) Patent No.: US 8,928,044 B2
(45) Date of Patent: Jan. 6, 2015

(54) DISPLAY DEVICE, SWITCHING CIRCUIT AND FIELD EFFECT TRANSISTOR

(75) Inventors: Yoshitaka Ozeki, Aichi (JP); Yasuhito Kuwahara, Aichi (JP); Shigetaka Toriyama, Kanagawa (JP); Hiroyuki Ikeda, Tokyo (JP)

(73) Assignee: Japan Display West Inc., Chita-gun, Aichi-ken (JP)

( * ) Notice: Subject to any disclaimer, the term of this patent is extended or adjusted under 35 U.S.C. 154(b) by 101 days.

(21) Appl. No.: 12/984,767

(22) Filed: Jan. 5, 2011

(65) Prior Publication Data

US 2011/0169001 A1    Jul. 14, 2011

(30) Foreign Application Priority Data

Jan. 12, 2010    (JP) ................................ P2010-003575

(51) Int. Cl.
| | | |
|---|---|---|
| *H01L 29/00* | (2006.01) | |
| *H01L 29/786* | (2006.01) | |
| *H01L 29/423* | (2006.01) | |
| *G02F 1/1362* | (2006.01) | |

(52) U.S. Cl.
CPC .... *H01L 29/78696* (2013.01); *H01L 29/42384* (2013.01); *H01L 29/78609* (2013.01); *H01L 29/78645* (2013.01); *G02F 1/13624* (2013.01); *G02F 1/136286* (2013.01)
USPC .... 257/286; 257/202; 257/287; 257/E29.049; 438/195; 438/587

(58) Field of Classification Search
USPC .......... 257/286, 287, E29.049, 202; 438/197, 438/195, 587
See application file for complete search history.

(56) References Cited

U.S. PATENT DOCUMENTS

| | | | | |
|---|---|---|---|---|
| 6,686,300 | B2 * | 2/2004 | Mehrotra et al. | ............. 438/142 |
| 7,982,247 | B2 * | 7/2011 | Riviere-Cazaux | ............ 257/240 |
| 2002/0113277 | A1 | 8/2002 | Mehrotra et al. | |
| 2008/0186772 | A1 * | 8/2008 | Horch | ...................... 365/185.18 |
| 2009/0140346 | A1 * | 6/2009 | Edwards et al. | .............. 257/369 |

FOREIGN PATENT DOCUMENTS

| | | |
|---|---|---|
| JP | 61-226669 | 10/1986 |
| JP | 05-121439 | 5/1993 |
| JP | 07-147411 | 6/1995 |
| JP | 09-082969 | 3/1997 |
| JP | 2002-009629 | 1/2002 |
| JP | 2002-221737 | 8/2002 |
| JP | 2005-079476 | 3/2005 |
| JP | 2009-182173 | 8/2009 |

OTHER PUBLICATIONS

Taiwanese Office Action issued Sep. 16, 2013 in corresponding Taiwanese Patent Application No. 100100193.
Japanese Office Action issued Feb. 25, 2014 in corresponding Japanese Patent Application No. 2010-003575.
Chinese Office Action issued May 26, 2014 in corresponding Chinese Patent Application No. 201110002057.1.

* cited by examiner

*Primary Examiner* — Kenneth Parker
*Assistant Examiner* — John Lin
(74) *Attorney, Agent, or Firm* — K&L Gates LLP

(57) ABSTRACT

A this film transistor is provided. The thin film transistor includes a semiconductor layer including a source region, a drain region, and a channel region, wherein the channel region is provided between the source region and the drain region; and a gate electrode overlapping with the channel region, wherein the channel region includes at least a portion of a channel width that is configured to at least one of continuously decrease and continuously increase in a lengthwise direction.

4 Claims, 20 Drawing Sheets

FIG.4
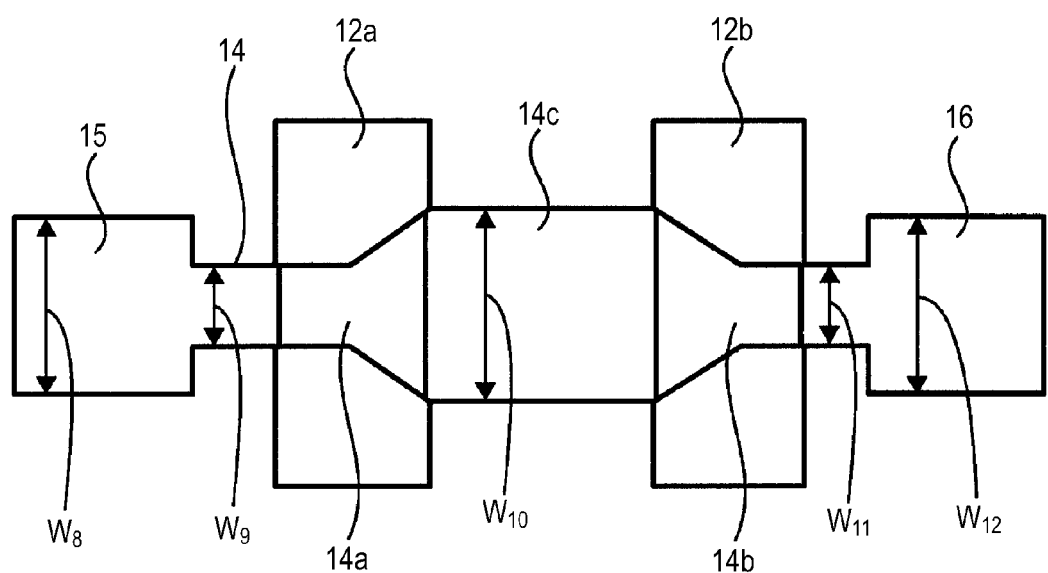
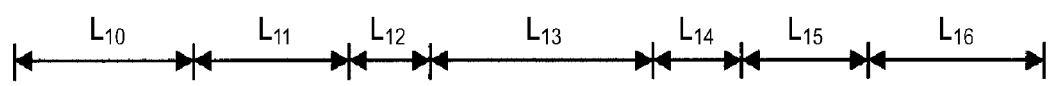

FIG.8
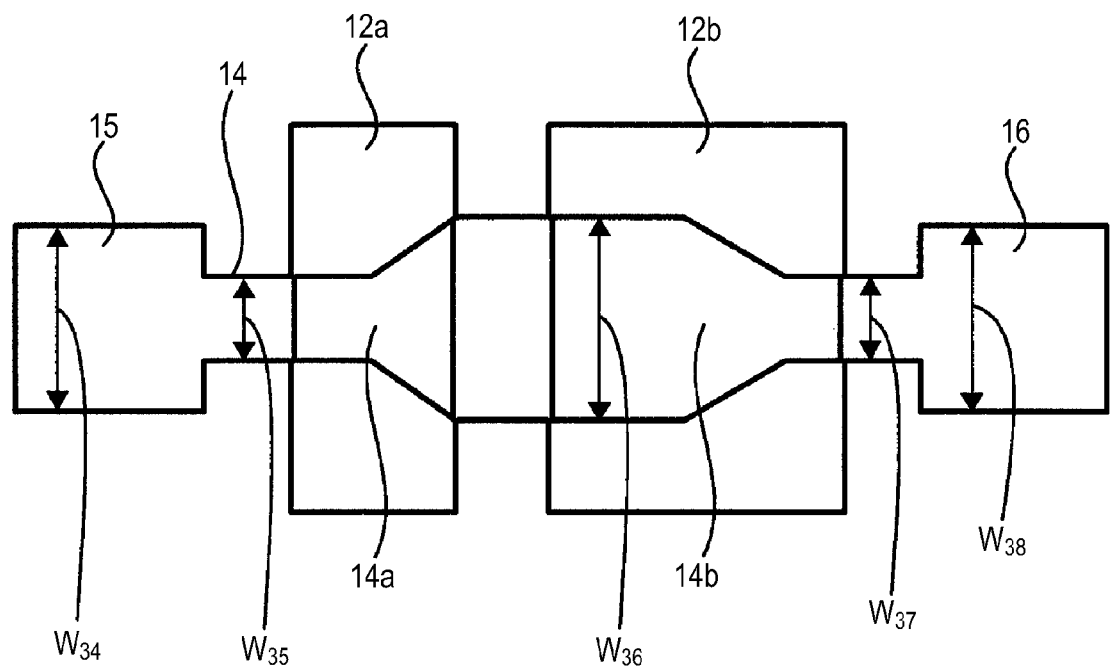
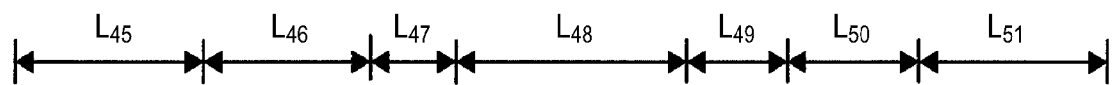

FIG.10
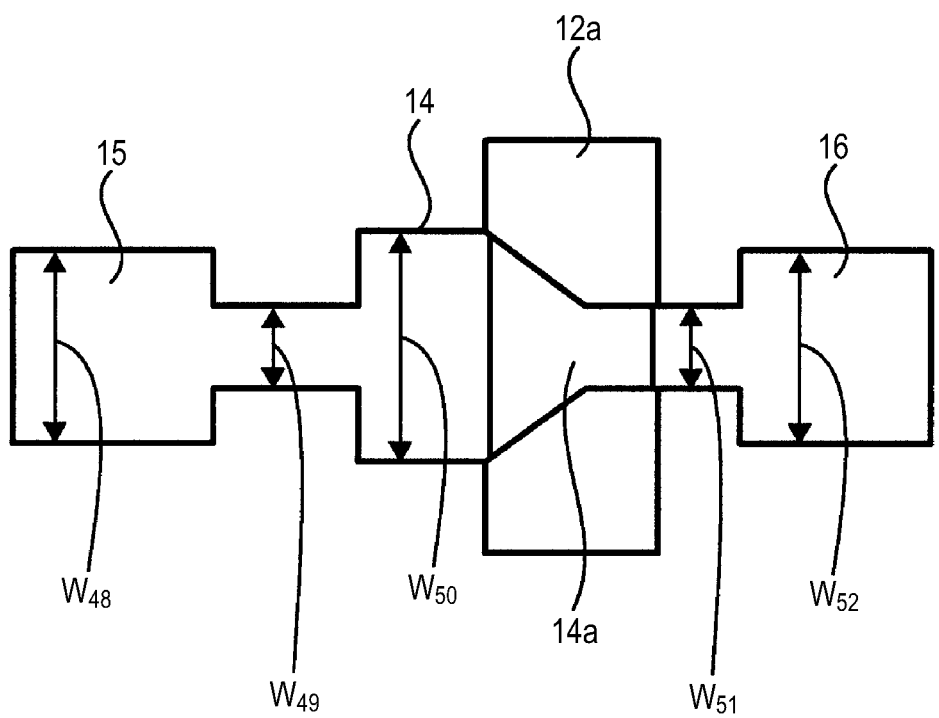
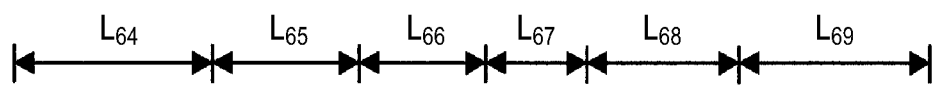

FIG.11
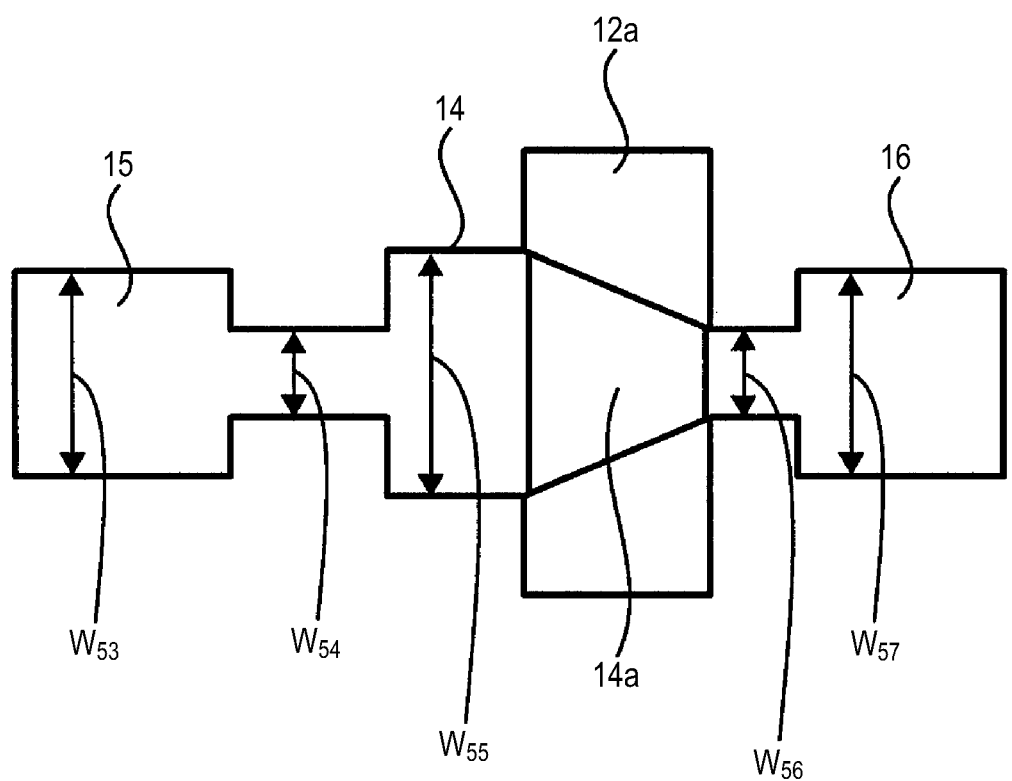
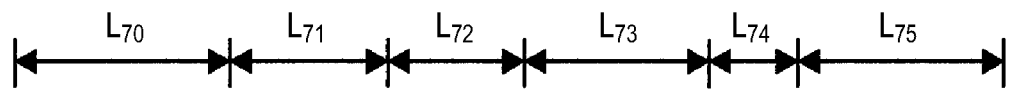

FIG.14
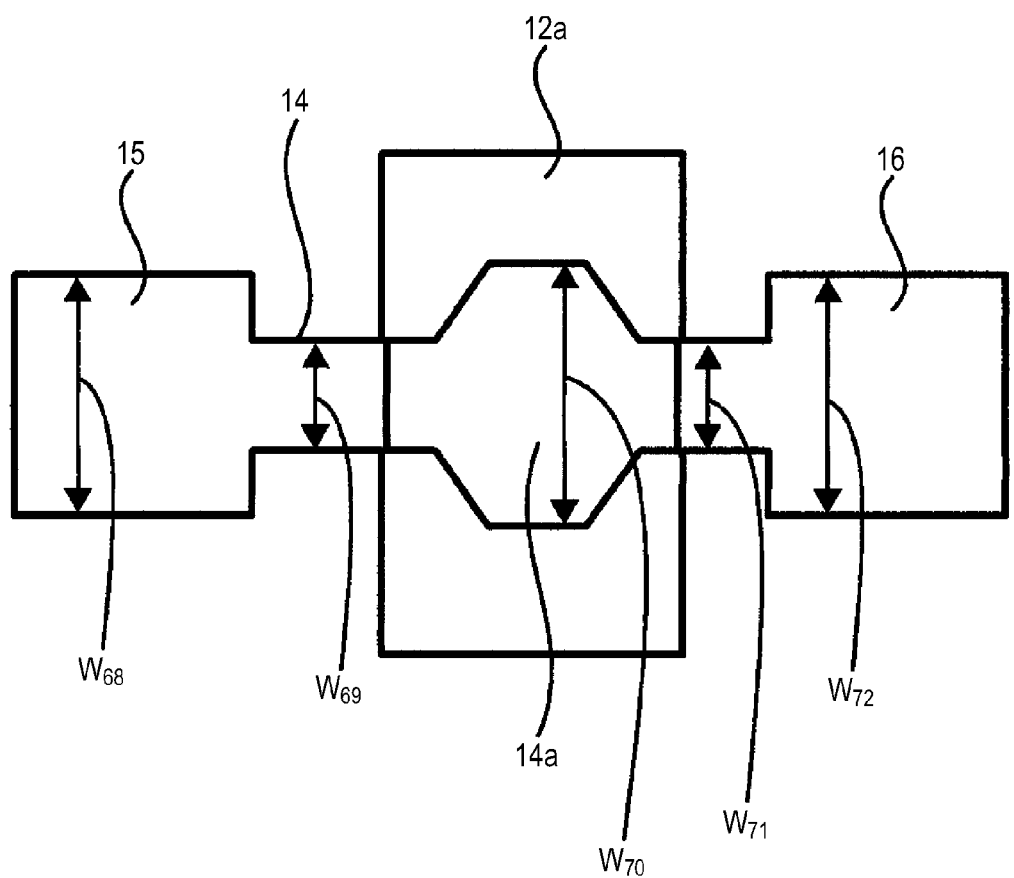
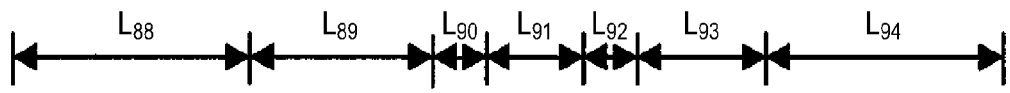

DISPLAY DEVICE, SWITCHING CIRCUIT AND FIELD EFFECT TRANSISTOR

CROSS REFERENCES TO RELATED APPLICATIONS

The present application claims to Japanese Priority Patent Application JP 2010-003575 filed in the Japan Patent Office on Jan. 12, 2010, the entire contents of which is hereby incorporated by reference.

BACKGROUND

The present application relates to a display device, a switching circuit and a field effect transistor, and is preferentially applied to, for example, a liquid crystal display device or an organic electroluminescence (EL) display device.

A liquid crystal display device is widely used as a flat-panel display. In some of the liquid crystal display devices, a thin film transistor (TFT) as a kind of a field effect transistor is used in a switching circuit for driving pixels. As an example of a related art liquid crystal display device using the thin film transistor, an active matrix driving liquid crystal display device of IPS (In Plane Switching) mode or FFS (Fringe Field Switching) mode is known. FIG. 17 and FIG. 18 show one form of such a liquid crystal display device. Here, FIG. 17 is a sectional view of the liquid crystal display device, and FIG. 18 is a plan view of the liquid crystal display device.

As shown in FIG. 17 and FIG. 18, in this liquid crystal display device, a TFT substrate 100 and an opposite substrate 200 are provided to be opposite to each other through a liquid crystal (not shown) therebetween, and the distance between them is regulated by a spacer 300 provided on the opposite substrate 200.

In the TFT substrate 100, a gate wiring line 102 and gate electrodes 102a and 102b branching from the gate wiring line 102 are provided on a transparent glass substrate 101. A gate insulating film 103 is provided so as to cover the gate wiring line 102 and the gate electrodes 102a and 102b. The gate insulating film 103 includes two layers of a lower insulating film 103a and an upper insulating film 103b. A silicon thin film 104 having a specified shape, which becomes a channel, is provided on the gate insulating film 103 and extends over the gate electrodes 102a and 102b. An impurity is doped in the silicon thin film 104 except portions of channel parts 104a and 104b above the gate electrodes 102a and 102b. An impurity doped region on one end side of the silicon thin film 104 forms a source region 105, and an impurity doped region at the other end side forms a drain region 106. Reference numeral 104c denotes an impurity doped region. A thin film transistor T' of a switching circuit for driving pixels, which has a structure (or a dual gate structure) in which two thin film transistors are electrically connected in series to each other, includes the gate electrodes 102a and 102b, the gate insulating film 103, the source region 105 and the drain region 106. FIG. 19 is a plan view of a portion of the thin film transistor T'. As shown in FIG. 19, the silicon thin film 104 which becomes the channel of the thin film transistor T' has a constant width w1 in a channel length direction.

Interlayer insulating films 107 and 108 are provided so as to cover the silicon thin film 104. A contact hole 109 is provided in portions of the interlayer insulating films 107 and 108 above the source region 105. Besides, a contact hole 110 is provided in portions of the interlayer insulating films 107 and 108 above the drain region 106. A data line 111 contacts the source region 105 through the contact hole 109. Besides, a lead electrode 112 contacts the drain region 106 through the contact hole 110. Barrier metal films 113 are provided on the data line 111 and the lead electrode 112. An interlayer insulating film 114 is provided so as to cover the data line 111 and the lead electrode 112. A contact hole 114a is provided in a portion of the interlayer insulating film 114 above the lead electrode 112. The surface of the interlayer insulating film 114 is flattened except for a portion of the contact hole 114a, and a common electrode 115 is provided on the flattened surface. The common electrode 115 has an opening 115a in a portion above the lead electrode 112, which is larger than the contact hole 114a. An interlayer insulating film 116 is provided so as to cover the common electrode 115. A contact hole 116a is provided in a portion of the interlayer insulating film 116 above the lead electrode 112. A pixel electrode 117 is provided on the interlayer insulating film 116. The pixel electrode 117 is connected to the barrier metal film 113 and the lead electrode 112 through the contact hole 116a, and is connected to the drain region 106 of the thin film transistor T' through the lead electrode 112. A holding capacitive element C' is formed by the structure in which the interlayer insulating film 116 is sandwiched between the pixel electrode 117 and the common electrode 115. The pixel electrode 117 has a slit-shaped opening 117a. When a voltage is applied between the pixel electrode 117 and the common electrode 115, the liquid crystal (not shown) is driven by an electric field generated between the pixel electrode 117 and the common electrode 115 in the opening 117a.

On the other hand, in the opposite substrate 200, color filters 202 and 203 are provided on a transparent glass substrate 201 in such a manner that parts thereof overlap with each other. A flattening layer 204 is provided on these color filters 202 and 203. The spacer 300 is provided on the flat surface of the flattening layer.

In the foregoing liquid crystal display device, it is necessary that the thin film transistor T' for pixel driving has such a sufficiently high ON current characteristic that a pixel potential can be written, and has such a sufficiently suppressed OFF current characteristic that the written potential is held. However, with improvement in definition of a liquid crystal display device and advancement of requested characteristics of optical standards, the luminance of a backlight is made high, and a very intense incident light is irradiated to the thin film transistor T' from the backlight. Thus, the light leak current of the thin film transistor T' increases, an OFF-current characteristic is degraded, the contrast of the liquid crystal display device is reduced, and poor picture quality due to flicker and streak-like unevenness occurs. In the thin film transistor T', the silicon thin film 104 which is sensitive to light is used as the element region, when light is irradiated to an end of the drain region 106 of the silicon thin film 104, a carrier due to light excitation is generated in the channel part, a light leak of the thin film transistor T' occurs by that, and the picture quality of the liquid crystal display device is badly influenced.

Hitherto, in order to reduce the light leak current of the thin film transistor T', as shown in FIG. 20, the width of the silicon thin film 104 as the channel is made uniformly narrow in the channel length direction and a width w2 is made smaller than w1.

SUMMARY

However, as shown in FIG. 20, in the method in which the width of the silicon thin film 104 of the thin film transistor T' is made uniformly narrow in the channel length direction in order to reduce the light leak current of the thin film transistor T', although the OFF current characteristic is suppressed, the ON current characteristic is also reduced. Thus, there is a case where a trouble occurs in the performance of writing pixel potential, and this is a problem (see JP-A-5-121439 and Japanese Patent No. 3551952 (Patent Documents 1 and 2)).

Thus, it is desirable to provide a display device in which suppression of the OFF current characteristic of a field effect transistor used in a switching circuit for driving pixels and improvement of the ON current characteristic can be simultaneously realized, the performance of the switching circuit is improved and picture quality can be improved.

It is also desirable to provide a switching circuit in which suppression of the OFF current characteristic of a field effect transistor constituting a switching circuit and improvement of the ON current characteristic can be simultaneously realized, and the performance can be improved.

It is also desirable to provide a field effect transistor in which suppression of the OFF current characteristic and improvement of the ON current characteristic can be simultaneously realized, and the performance can be improved.

In an embodiment, a thin film transistor is provided. The thin film transistor includes a semiconductor layer including a source region, a drain region, and a channel region, wherein the channel region is provided between the source region and the drain region; and a gate electrode overlapping with the channel region, wherein the channel region includes at least a portion of a channel width that is configured to at least one of continuously decrease and continuously increase in a lengthwise direction.

In an embodiment, at least a first portion of the channel width is configured to continuously increase in the lengthwise direction and at least a second portion of the channel width is configured to continuously decrease in the lengthwise direction.

In an embodiment, at least the portion of the channel width is configured to at least one of linearly increase and linearly decrease in the lengthwise direction.

In an embodiment, the channel region includes a plurality of channel regions.

In an embodiment, the plurality of channel regions includes a first channel region having a first channel width and a second channel region having a second channel width, and wherein the first channel width and the second channel width are configured to at least one of continuously decrease and continuously increase in the lengthwise direction.

In an embodiment, the plurality of channel regions includes a third channel region having a third channel width that is uniform in size in the lengthwise direction.

In an embodiment, the third channel region is provided between the first and second channel regions.

In an embodiment, at least two of the plurality of channel regions have different channel lengths.

In an embodiment, the channel width includes a source channel width portion directed to the source region and a drain channel width portion directed to the drain region, and wherein the source channel width portion is greater in size as compared to the drain channel width portion.

In an embodiment, the channel width includes a source channel width portion directed to the source region and a drain channel width portion directed to the drain region, and wherein the source channel width portion is lesser in size as compared to the drain channel width portion.

In an embodiment, the channel width includes a source channel width portion directed to the source region and a drain channel width portion directed to the drain region, and wherein the source channel width portion and the drain channel width portion are equal in size.

In a further embodiment, a switching circuit is provided. The switching circuit includes a thin film transistor including a semiconductor layer including a source region, a drain region, and a channel region, wherein the channel region is provided between the source region and the drain region; and a gate electrode overlapping with the channel region, wherein the channel region includes at least a portion of a channel width that is configured to at least one of continuously decrease and continuously increase in a lengthwise direction.

In an embodiment, the channel region is configured to be in electrical connection with a data line and a pixel electrode.

In an embodiment, the switching circuit is configured to improve an ON current characteristic and suppress an OFF current characteristic.

In another embodiment, a display device is provided. The display device includes a thin film transistor, the thin film transistor includes a semiconductor layer including a source region, a drain region, and a channel region, wherein the channel region is provided between the source region and the drain region; and a gate electrode overlapping with the channel region, wherein the channel region includes a channel width that is configured to at least one of continuously decrease and continuously increase in a lengthwise direction.

In an embodiment, the display device includes a switching circuit including the thin film transistor, and wherein the channel region is in electrical connection with a data line and a pixel electrode.

In an embodiment, the display device is configured to improve an ON current characteristic and suppress an OFF current characteristic.

In yet a further embodiment, a method of producing a thin film transistor is provided. The method includes forming a semiconductor layer including a source region, a drain region, and a channel region, wherein the channel region is provided between the source region and the drain region; and a gate electrode overlapping with the channel region, wherein the channel region includes a channel width that is configured to at least one of continuously decrease and continuously increase in a lengthwise direction.

In the respective embodiments, the width of the semiconductor layer of at least one field effect transistor on the drain side and that on the source side may be different from each other, or the width of the semiconductor layer of at least one field effect transistor on the drain side and that on the source side may be equal to each other, and that in an intermediate region in the channel length direction may be larger. Here, the drain side means a terminal side to which a high electric field is applied at the time of operation in the relevant field effect transistor, and the source side means a terminal side to which a low electric field is applied at the time of operation in the relevant field effect transistor. In a typical example of the case where the width of the semiconductor layer of at least one field effect transistor on the drain side is different from that on the source side, the width of the semiconductor layer of at least one field effect transistor on the drain side is smaller that that on the source side. Besides, the width of a semiconductor layer, on the drain side, of a source side end field effect transistor among plural field effect transistors is smaller than that on the source side. Alternatively, the width of a semiconductor layer, on the drain side, of a drain side end field effect transistor among plural field effect transistors is smaller than that on the source side. There is also a case where the channel length of at least one field effect transistor among plural field effect transistors is different from the channel length of another field effect transistor. In the field effect transistor, a gate electrode is provided on a semiconductor layer through a gate insulating film, and a voltage applied to the gate electrode is changed, so that a current flowing between a source region and a drain region provided in the semiconductor layer is controlled. The semiconductor layer of the field effect transistor may be basically arbitrary as long as the semiconductor layer has photosensitivity, and the most typical layer is a silicon layer. Although the display device is, for example, a liquid crystal display device or an organic EL display device, no limitation is made to these. Besides, the liquid crystal display device may be other than an IPS or FFS mode device.

According to an embodiment constructed as described above, for example, the width of the semiconductor layer which becomes the channel of at least one field effect transistor is made narrow on the drain side, so that the rise of the leak current at the time of light irradiation, that is, the rise of the OFF current can be suppressed. Further, the width on the source side is made larger than that on the drain side, so that the ON current can be improved.

According to an embodiment, the suppression of the OFF current characteristic and the improvement of the ON current characteristic of the field effect transistor used in the switching circuit for driving pixels can be simultaneously realized, and the picture quality of the display device can be improved by the improvement of the performance of the switching circuit.

Besides, the suppression of the OFF current characteristic and the improvement of the ON current characteristic of the field effect transistor can be simultaneously realized, and the improvement of the performance of the switching circuit can be realized.

Besides, the suppression of the OFF current characteristic and the improvement of the ON current characteristic of the field effect transistor can be simultaneously realized.

Additional features and advantages are described herein, and will be apparent from the following Detailed Description and the figures.

BRIEF DESCRIPTION OF THE FIGURES

FIG. 4 is a plan view of a pixel driving thin film transistor part of a liquid crystal display device of a second embodiment.

FIG. 8 is a plan view of a pixel driving thin film transistor part of a liquid crystal display device of a sixth embodiment.

FIG. 10 is a plan view of a pixel driving thin film transistor part of a liquid crystal display device of an eighth embodiment.

FIG. 11 is a plan view of a pixel driving thin film transistor part of a liquid crystal display device of a ninth embodiment.

FIG. 14 is a plan view of a pixel driving thin film transistor part of a liquid crystal display device of a twelfth embodiment.

DETAILED DESCRIPTION

Embodiments of this application will be described below with reference to the drawings. The description is made in the following sequence.

1. First embodiment (liquid crystal display device)
2. Second embodiment (liquid crystal display device)
3. Third embodiment (liquid crystal display device)
4. Fourth embodiment (liquid crystal display device)
5. Fifth embodiment (liquid crystal display device)
6. Sixth embodiment (liquid crystal display device)
7. Seventh embodiment (liquid crystal display device)
8. Eighth embodiment (liquid crystal display device)
9. Ninth embodiment (liquid crystal display device)
10. Tenth embodiment (liquid crystal display device)
11. Eleventh embodiment (liquid crystal display device)
12. Twelfth embodiment (liquid crystal display device)
13. Thirteenth embodiment (liquid crystal display device)

1. First Embodiment

Liquid Crystal Display Device

Figure 1:
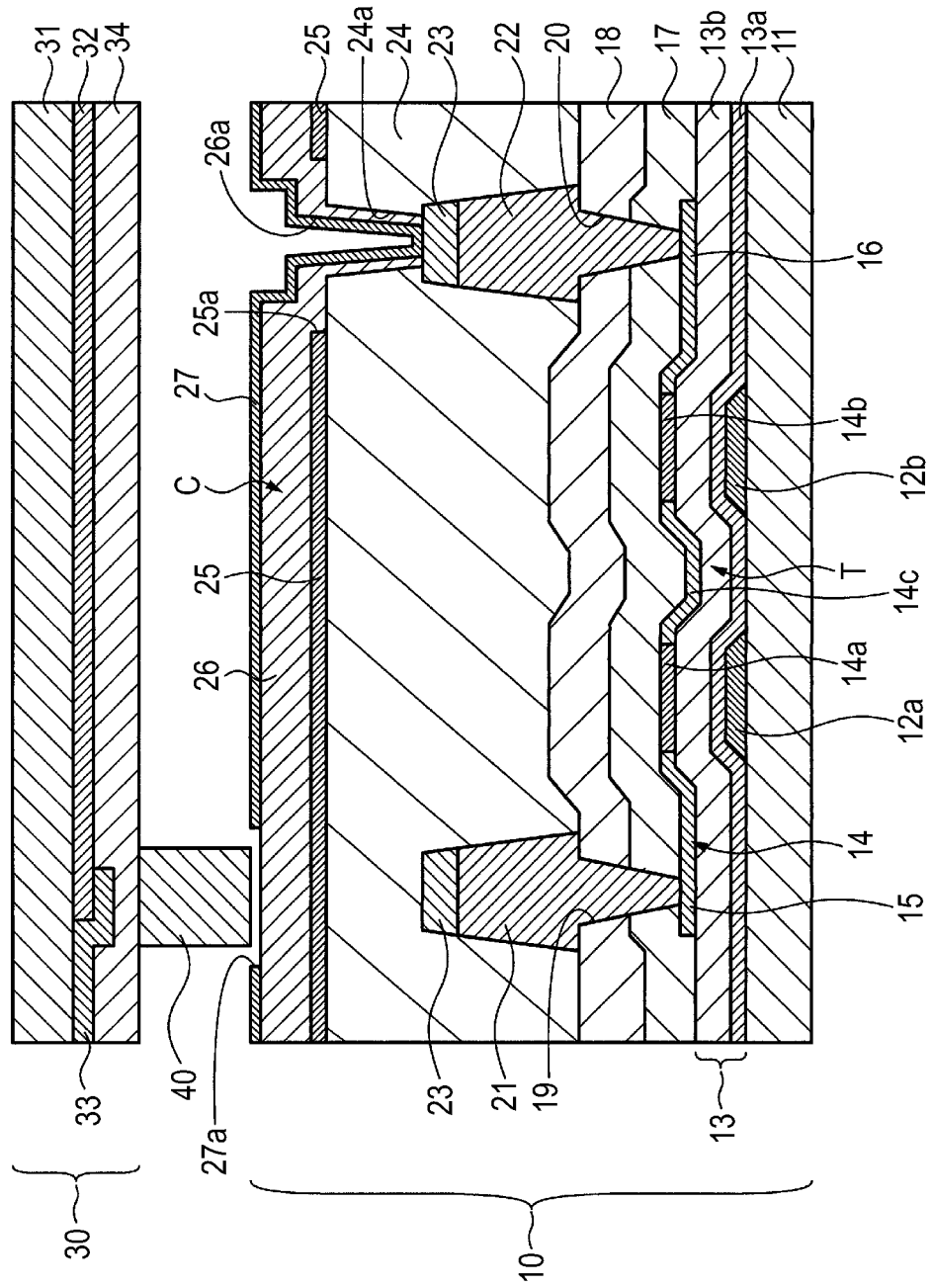
FIG. 1 is a sectional view showing a liquid crystal display device of a first embodiment.
Figure 2:
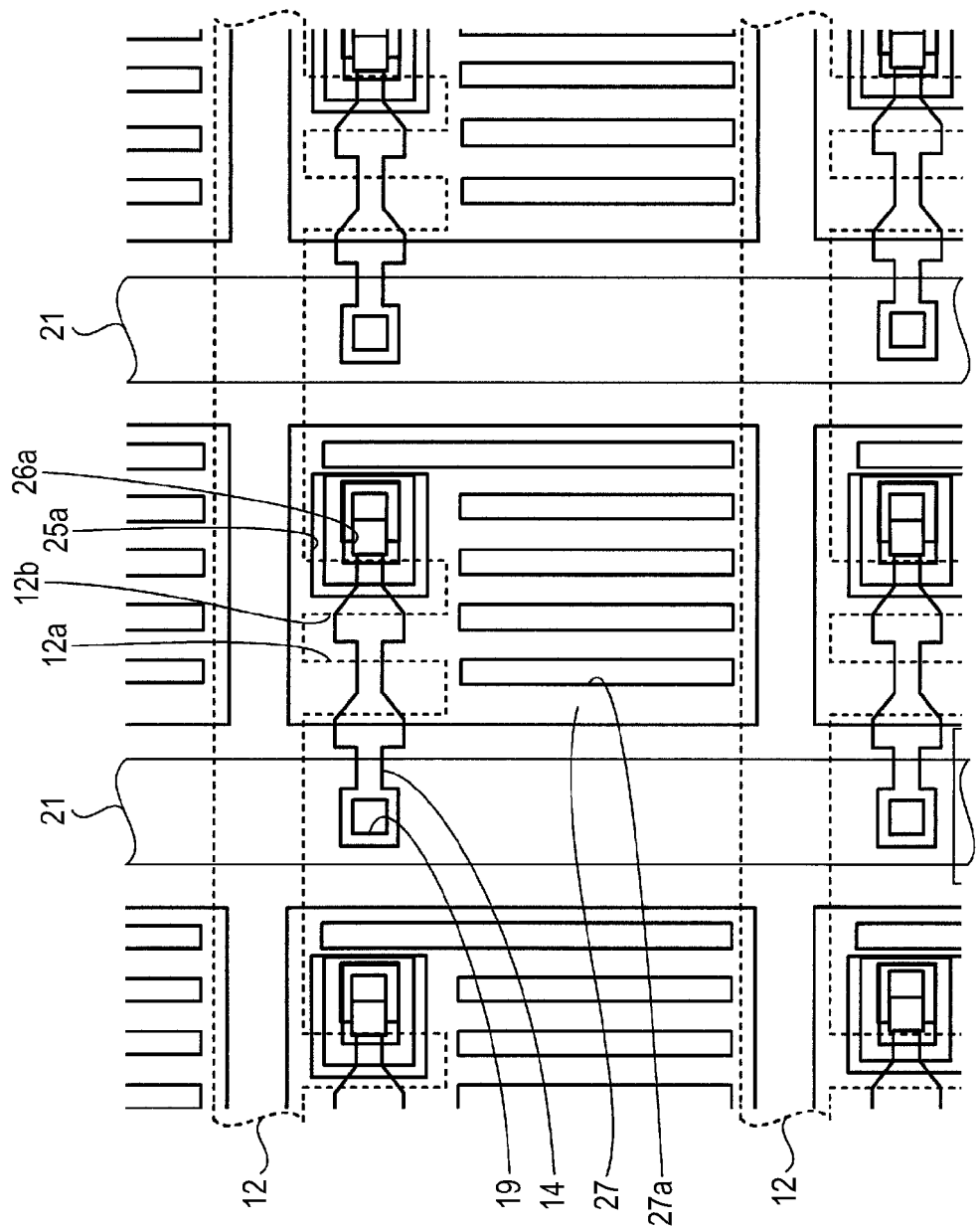
FIG. 2 is a plan view showing the liquid crystal display device of the first embodiment.

FIG. 1 and FIG. 2 shows a liquid crystal display device of a first embodiment. The liquid crystal display device is an active matrix driving liquid crystal display device of IPS mode or FFS mode. Here, FIG. 1 is a sectional view of the liquid crystal display device, and FIG. 2 is a plan view of the liquid crystal display device.

As shown in FIG. 1 and FIG. 2, in the liquid crystal display device, a TFT substrate 10 and an opposite substrate 30 are provided to be opposite to each other through a liquid crystal (not shown) therebetween, and the distance between them is regulated by a spacer 40 provided on the opposite substrate 30.

In the TFT substrate 10, a gate wiring line 12 and gate electrodes 12a and 12b branching from the gate wiring line 12 are provided on a transparent substrate 11 such as a transparent glass substrate. Although the gate wiring line 12 and the gate electrodes 12a and 12b are made of metal such as chromium (Cr), aluminum (Al), molybdenum (Mo), tantalum (Ta), tungsten (W) or titanium (Ti), no limitation is made to this. A gate insulating film 13 is provided so as to cover the gate wiring line 12 and the gate electrodes 12a and 12b. The gate insulating film 13 includes two layers of a lower insulating film 13a and an upper insulating film 13b. For example, a silicon nitride film (SiN film) is used as the lower insulating film 13a, and for example, a silicon dioxide film ($SiO_2$ film) is used as the upper insulating film 13b. However, no limitation is made to this. A semiconductor thin film 14 having a specified shape is provided on the gate insulating film 13 and extends over the gate electrodes 12a and 12b. Although the semiconductor thin film 14 is typically a silicon thin film, for example, a polycrystalline silicon thin film or an amorphous silicon thin film, no limitation is made to this. The semiconductor thin film 14 is doped with impurity except for channel parts 14a and 14b of portions above the gate electrodes 12a and 12b. An impurity doped region of the semiconductor thin film 14 on one end side forms a source region 15, and an impurity doped region on the other end side forms a drain region 16. Reference numeral 14c denotes an impurity doped region. A thin film transistor T of a switching circuit for driving pixels, which has a structure (or dual gate structure) in which two thin film transistors are electrically connected in series to each other, includes the gate electrodes 12a and 12b, the gate insulating film 13, and the semiconductor thin film 14 in which the source region 15, the drain region 16 and the channel parts 14a and 14b are formed. The thin film transistor T has a bottom gate structure in which the gate electrodes 12a and 12b are provided under the semiconductor thin film 14. When the thin film transistor T has an n-channel, an n-type impurity such as phosphorus (P) or arsenic (As) is used as the impurity of the source region 15 and the drain region 16. When the thin film transistor T has a p-channel, a p-type impurity such as boron (B) is used as the impurity of the source region 15 and the drain region 16.

Interlayer insulating films 17 and 18 are provided so as to cover the semiconductor thin film 14. For example, a SiN film is used as the interlayer insulating film 17, and for example, a SiO$_2$ film is used as the interlayer insulating film 18. However, no limitation is made to this. A contact hole 19 is provided in portions of the interlayer insulating films 17 and 18 above the source region 15. Besides, a contact hole 20 is provided in portions of the interlayer insulating films 17 and 18 above the drain region 16. A data line 21 contacts the source region 15 through the contact hole 19. Besides, a lead electrode 22 contacts the drain region 16 through the contact hole 20. Although the data line 21 and the lead electrode 22 are made of metal such as Cr, Al, Mo, Ta, W or Ti, no limitation is made to this. Barrier metal films 23 are provided on the data line 21 and the lead electrode 22. An interlayer insulating film 24 is provided so as to cover the data line 21 and the lead electrode 22. Although, for example, photosensitive acryl resin or the like is used as the interlayer insulating film 24, no limitation is made to this. A contact hole 24a is provided in a portion of the interlayer insulating film 24 above the lead electrode 22. The surface of the interlayer insulating film 24 is flattened except for a portion of the contact hole 24a, and a common electrode 25 is provided on the flattened surface. The common electrode 25 is made of a transparent conductive material such as, for example, indium tin oxide (ITO). The common electrode 25 has an opening 25a, which is larger than the contact hole 24a, at a portion above the lead electrode 22. An interlayer insulating film 26 is provided so as to cover the common electrode 25. Although, for example, a SiO$_2$ film is used as the interlayer insulating film 26, no limitation is made to this. A contact hole 26a is provided in a portion of the interlayer insulating film 26 above the lead electrode 22. Although, for example, a SiO$_2$ film or a SiN film is used as the interlayer insulating film 26, no limitation is made to this. A pixel electrode 27 is provided on the interlayer insulating film 26. The pixel electrode 27 is made of, for example, a transparent conductive material such as ITO. The pixel electrode 27 contacts the barrier metal film 23 and the lead electrode 22 through the contact hole 26a, and is connected to the drain region 16 of the thin film transistor T through the lead electrode 22. A holding capacitive element C includes a structure in which the interlayer insulating film 26 is sandwiched between the pixel electrode 27 and the common electrode 25. The pixel electrode 27 has a slit-like opening 27a. The liquid crystal (not shown) is driven by an electric field generated between the pixel electrode 27 and the common electrode 25 in the opening 27a when a voltage is applied between the pixel electrode 27 and the common electrode 25.

On the other hand, in the opposite substrate 30, color filters (only two color filters 32 and 33 are shown in FIG. 1) of red (R), green (G) and blue (B) are provided on a transparent substrate 31 such as a transparent glass substrate, while parts thereof overlap with each other. A flattening layer 34 is provided on the color filters 32 and 33. The spacer 40 is provided on the flat surface of the flattening layer 34.

Figure 3:
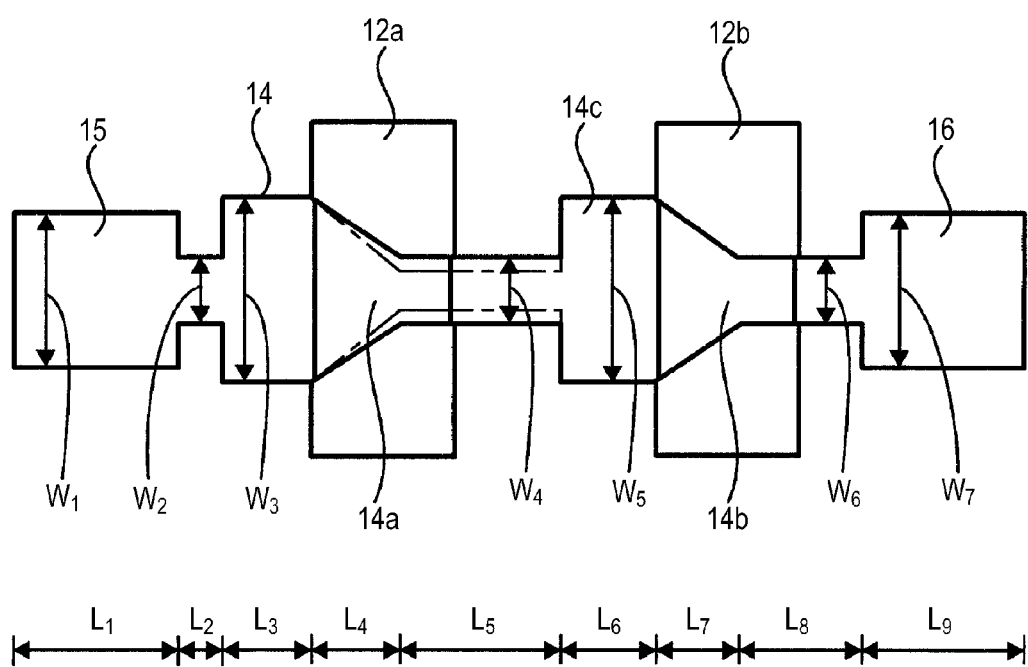
FIG. 3 is a plan view of a pixel driving thin film transistor part of the liquid crystal display device of the first embodiment.

FIG. 3 is a plan view of a portion of the thin film transistor T in the liquid crystal display device. As shown in FIG. 3, in this case, the width of the semiconductor thin film 14, which becomes a channel of the thin film transistor T, is changed in the channel length direction. That is, the width of the semiconductor thin film 14 is changed from an end on the source region 15 side in such a way that the width is $W_1$ in length $L_1$, $W_2$ smaller than $W_1$ in length $L_2$, $W_3$ larger than $W_2$ in length $L_3$, linearly decreases from $W_3$ to $W_4$ in length $L_4$, $W_4$ in length $L_5$, $W_5$ larger than $W_4$ in length $L_6$, linearly decreases from $W_5$ to $W_6$ in length $L_7$, $W_6$ in length $L_8$, and $W_7$ larger than $W_6$ in length $L_9$ to an end on the drain region 16 side. Particularly, in the channel part 14a substantially overlapping with the gate electrode 12a in the semiconductor thin film 14, the width linearly decreases from width $W_3$ on the source region 15 side to $W_4$, and the other portion has the constant width $W_4$. Similarly, in the channel part 14b substantially overlapping with the gate electrode 12b in the semiconductor thin film 14, the width linearly decreases from the width $W_5$ on the source region 15 side to $W_6$, and the other portion has the constant width $W_6$. The widths $W_1$ to $W_7$ and the lengths $L_1$ to $L_9$ are appropriately designed according to the performance required for the thin film transistor T. For example, when $W_4$, $W_6$ is 0.5 to 3.5 µm, $W_3$, $W_5$ is selected to be 3.5 to 10.5 µm. A typical example is that when $W_4$, $W_6$ is 2.0 µm, $W_3$, $W_5$ is 6.0 µm. The widths $W_4$ and $W_6$ may be different from each other, and for example, as indicated by an alternate long and short dash line in FIG. 3, $W_4$ may be shorter than $W_6$. Besides, the widths $W_3$ and $W_5$ may also be different from each other. Besides, for example, $W_1$ is selected to be 3.0 to 15.0 µm, and $W_2$ is selected to be 0.5 to 10.0 µm. A typical example is $W_1$=8.0 µm and $W_2$=2.0 µm.

As illustrated in FIG. 3, the channel width linearly decreases from $W_3$ to $W_4$ in length $L_4$ and linearly decreases from $W_5$ to $W_6$ in length $L_7$. However, it should be appreciated that the decrease and/or increase in the channel width is not limited to a linear configuration but rather encompasses an increase and/or decrease in any suitable continuous manner in a lengthwise direction including a non-linear configuration deviating from the linear configuration in a suitable manner. For example, it should be appreciated that such deviations from the linear configuration can be due to the removal of a portion of the channel part during processing, thus for example, resulting in gradual and minor deviations from the linear configuration including producing an increase and/or decrease of the channel width in a curved, rounded and/or other like manner.

Next, a manufacturing method of the liquid crystal display device will be described.

First, as shown in FIG. 1 and FIG. 2, a metal film made of metal such as Cr, Al, Mo, Ta, W or Ti is formed on the transparent substrate 11 such as a transparent glass substrate by, for example, a sputtering method. Next, the metal film is patterned into a specified shape by photolithography and etching, and the gate wiring line 12 and the gate electrodes 12a and 12b are formed. Next, the gate insulating film 13 is formed by sequentially forming the insulating film 13a such as a SiN film and the insulating film 13b such as a $SiO_2$ film on the entire surface by, for example, a plasma CVD method so as to cover the gate wiring line 12 and the gate electrodes 12a and 12b. Next, an amorphous silicon thin film is formed on the gate insulating film 13 by, for example, a plasma CVD method. Next, the amorphous silicon thin film is crystallized by laser annealing using an excimer laser or a semiconductor laser or by lamp annealing. In this way, the semiconductor thin film 14 made of the polycrystalline silicon thin film is formed. Next, after a resist pattern (not shown) having a specified shape is formed on the semiconductor thin film 14 by photolithography, an impurity is doped in a specified portion of the semiconductor thin film by ion implantation or the like while the resist pattern is used as a mask. Next, after the resist pattern is removed, the semiconductor thin film 14 is patterned into the shape shown in FIG. 3 by photolithography and etching.

Next, the interlayer insulating films 17 and 18 are sequentially formed on the entire surface by, for example, a plasma CVD method so as to cover the semiconductor thin film 14. Next, specified portions of the interlayer insulating films 17 and 18 are etching-removed by photolithography and etching, and the contact holes 19 and 20 are formed. Next, a metal film made of metal such as Cr, Al, Mo, Ta, W or Ti and a barrier metal film are sequentially formed on the entire surface by, for example, a sputtering method. Next, the metal film and the barrier metal film are patterned by photolithography and etching, and the data line 21 and the lead electrode 22, which have the barrier metal layers 23 at the uppermost parts, are formed.

Next, for example, a photosensitive acryl resin is applied to the entire surface by, for example, a plasma CVD method so as to cover the data line 21 and the lead electrode 22. Next, the exposure and development of the acryl resin is performed by photolithography. The exposed portion of the acryl resin is removed by the development. In this way, the interlayer insulating film 24 is formed which has the contact hole 24a and the surface of which is flat except for the portion of the contact hole 24a. Next, for example, an ITO film is formed on the interlayer insulating film 24 by, for example, a sputtering method. Next, the common electrode 25 is formed by patterning the ITO film by photolithography and etching. Next, the interlayer insulating film 26 is formed on the entire surface by, for example, a sputtering method so as to cover the common electrode 25. Next, a specified portion of the interlayer insulating film 26 is etching-removed by photolithography and etching, and the contact hole 26a is formed. Next, for example, an ITO film is formed on the interlayer insulating film 26 by, for example, a sputtering method. Next, the ITO film is patterned by photolithography and etching, and the pixel electrode 27 is formed.

On the other hand, the color filters 32 and 33 of red, green and blue are formed on the transparent substrate 31 such as a transparent glass substrate. Specifically, in order to form, for example, the red color filter, a red color resist made of, for example, a negative resist is applied, and then, exposure and development are performed by photolithography so that the resist pattern remains on the portion where the red color filter is to be formed. Similarly, the green color filter and the blue color filter can be formed. Next, the flattening layer 34 is formed in order to flatten the roughness formed on the overlap part of the respective color filters. Next, the spacer 40 is formed on the flattening layer 34. In order to form the spacer 40, for example, a positive resist is applied, and then, exposure and development of the positive resist is performed by photolithography.

After the TFT substrate 10 and the opposite substrate 30 are formed in the manner as described above, the TFT substrate 10 and the opposite substrate 30 are bonded, and after liquid crystal (not shown) is injected into the space between them, the periphery of the TFT substrate 10 and the opposite substrate 30 is sealed with a sealing material (not shown).

The objective liquid crystal display device is manufactured in the manner as described above.

According to the first embodiment, the following various merits can be obtained. That is, since the width (channel width) of the semiconductor thin film 14 in the channel parts 14a and 14b of the thin film transistor T is made such that the width on the drain region 16 side is smaller than the width on the source region 15 side, the rise of the leak current at the time of light irradiation, that is, the rise of the OFF current can be suppressed. Further, since the width of the semiconductor thin film 14 on the source region 15 side is larger than the width of the semiconductor thin film 14 on the drain region 16 side, when the width of the semiconductor thin film 14 on the source region 15 side is made sufficiently large, the ON current can be improved. That is, according to the first embodiment, the suppression of the OFF current and the improvement of the ON current of the thin film transistor T can be simultaneously realized. Besides, since the width of the semiconductor thin film 14 is continuously changed in the channel length direction, when the semiconductor thin film 14 is formed by photolithography and etching, the formation of the resist pattern and etching can be excellently performed. Thus, it is possible to prevent a residue from occurring at the time of formation of the resist pattern and at the time of etching of the semiconductor thin film 14, and the distance between the patterns of the adjacent semiconductor thin films 14 can be kept at a distance as designed. Thus, a risk that a short occurs between the semiconductor thin films 14 can be reduced, and the yield of the liquid crystal display device can be improved. Besides, since the width of the semiconductor thin film 14 is continuously changed in the channel length direction, unlike the case where the width of the semiconductor thin film 14 is discontinuously changed, there does not arise a problem that an electric field is concentrated in the discontinuous portion, and damage occurs by heat generation due to Joule heat in this portion or by hot carriers. That is, since the electric field concentration in the semiconductor thin film 14 can be relaxed, the deterioration of the thin film transistor T can be prevented, and the life of the thin film transistor T can be prolonged. Consequently, the life of the liquid crystal display device can be prolonged.

2. Second Embodiment

Liquid Crystal Display Device

In this second embodiment, a pattern of a semiconductor thin film 14 of a thin film transistor T is different from that of the first embodiment. Specifically, as shown in FIG. 4, the width of the semiconductor thin film 14 is changed from an end on a source region 15 side in such a way that the width is $W_8$ in length $L_{10}$, $W_9$ smaller than $W_8$ in length $L_{11}$, linearly increases from $W_9$ to $W_{10}$ in length $L_{12}$, $W_{10}$ in length $L_{13}$, linearly decreases from $W_{10}$ to $W_{11}$ in length $L_{14}$, $W_{11}$ in length $L_{15}$, and $W_{12}$ larger than $W_{11}$ in length $L_{16}$ to an end on a drain region 16 side. Particularly, in a channel part 14a substantially overlapping with a gate electrode 12a in the semiconductor thin film 14, a portion on the source region 15 side has the constant width W9, and the width of the other portion linearly increases from $W_9$ to $W_{10}$. Besides, in a channel part 14b substantially overlapping with a gate electrode 12b in the thin film transistor 14, the width linearly decreases from the width $W_{10}$ on the source region 15 side to $W_{11}$, and the other portion has the constant width $W_{11}$. The widths $W_8$ to $W_{12}$ and the lengths $L_{10}$ to $L_{16}$ are appropriately designed according to the performance required for the thin film transistor T. For example, when $W_9$, $W_{11}$ is 0.5 to 3.5 μm, $W_{10}$ is selected to be 3.5 to 10.5 μm. A typical example is that when $W_9$, $W_{11}$ is 2.0 μm, $W_{10}$ is 6.0 μm. The widths $W_9$ and $W_{11}$ may be different from each other. Besides, for example, $W_8$ is selected to be 3.0 to 15.0 μm, and $W_9$ is selected to be 0.5 to 10.0 μm. A typical example is $W_8$=8.0 μm and $W_9$=2.0 μm.

The structure of this liquid crystal display device other than the above is the same as that of the liquid crystal display device of the first embodiment.

Besides, the manufacturing method of this liquid crystal display device is the same as the manufacturing method of the liquid crystal display device of the first embodiment.

According to the second embodiment, the same merits as those of the first embodiment can be obtained.

3. Third Embodiment

Liquid Crystal Display Device

Figure 5:
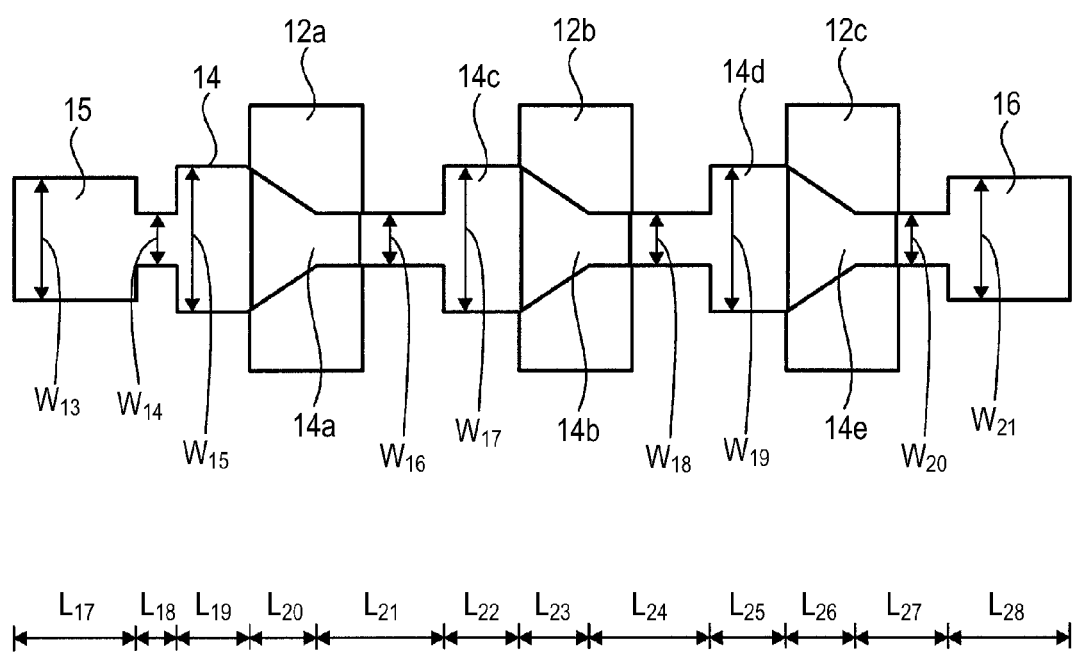
FIG. 5 is a plan view of a pixel driving thin film transistor part of a liquid crystal display device of a third embodiment.

This third embodiment is different from the first embodiment in that a thin film transistor T includes three thin film transistors electrically connected in series to each other. Specifically, as shown in FIG. 5, a semiconductor thin film 14 is provided to extend over three gate electrodes 12a, 12b and 12c. Reference numeral 14d denotes an impurity doped region similar to an impurity doped region 14c. The width of the semiconductor thin film 14 is changed from an end on a source region 15 side in such a way that the width is $W_{13}$ in length $L_{17}$, $W_{14}$ smaller than $W_{13}$ in length $L_{18}$, $W_{15}$ larger than $W_{14}$ in length $L_{19}$, linearly decreases from $W_{15}$ to $W_{16}$ in length $L_{20}$, $W_{16}$ in length $L_{21}$, $W_{17}$ larger than $W_{16}$ in length $L_{22}$, linearly decreases from $W_{17}$ to $W_{18}$ in length $L_{23}$, $W_{18}$ in length $L_{24}$, $W_{19}$ larger than $W_{18}$ in length $L_{25}$, linearly decreases from $W_{19}$ to $W_{20}$ in length $L_{26}$, $W_{20}$ in length $L_{27}$, and $W_{21}$ larger than $W_{20}$ in length $L_{28}$ to an end on a drain region 16 side. Particularly, in a channel part 14a substantially overlapping with the gate electrode 12a in the semiconductor thin film 14, the width of a portion on the source region 15 side linearly decreases from $W_{15}$ to $W_{16}$, and the other portion has the constant width $W_{16}$. Similarly, in a channel part 14b substantially overlapping with the gate electrode 12b in the semiconductor thin film 14, the width of a portion on the source region 15 side linearly decreases from $W_{17}$ to $W_{18}$, and the other portion has the constant width $W_{18}$. Similarly, in a channel part 14e substantially overlapping with the gate electrode 12c in the semiconductor thin film 14, the width of a portion on the source region 15 side linearly decreases from $W_{19}$ to $W_{20}$, and the other portion has the constant width $W_{20}$. The widths $W_{13}$ to $W_{21}$ and the lengths $L_{17}$ to $L_{28}$ are appropriately designed according to the performance required for the thin film transistor T. For example, when $W_{16}$, $W_{18}$, $W_{20}$ is 0.5 to 3.5 μm, $W_{15}$, $W_{17}$, $W_{19}$ is selected to be 3.5 to 10.5 μm. A typical example is that when $W_{16}$, $W_{18}$, $W_{20}$ is 2.0 μm, $W_{15}$, $W_{17}$, $W_{19}$ is 6.0 μm. The widths $W_{16}$, $W_{18}$ and $W_{20}$ may be different from each other. Besides, the widths $W_{15}$, $W_{11}$ and $W_{18}$ may also be different from each other. Besides, for example, $W_{13}$ is selected to be 3.0 to 15.0 μm, and $W_{14}$ is selected to be 0.5 to 10.0 μm. A typical example is $W_{13}$=8.0 μm and $W_{14}$=2.0 μm.

The structure of this liquid crystal display device other than the above is the same as that of the liquid crystal display device of the first embodiment.

Besides, the manufacturing method of this liquid crystal display device is the same as the manufacturing method of the liquid crystal display device of the first embodiment.

According to the third embodiment, the same merits as those of the first embodiment can be obtained.

4. Fourth Embodiment

Liquid Crystal Display Device

Figure 6:
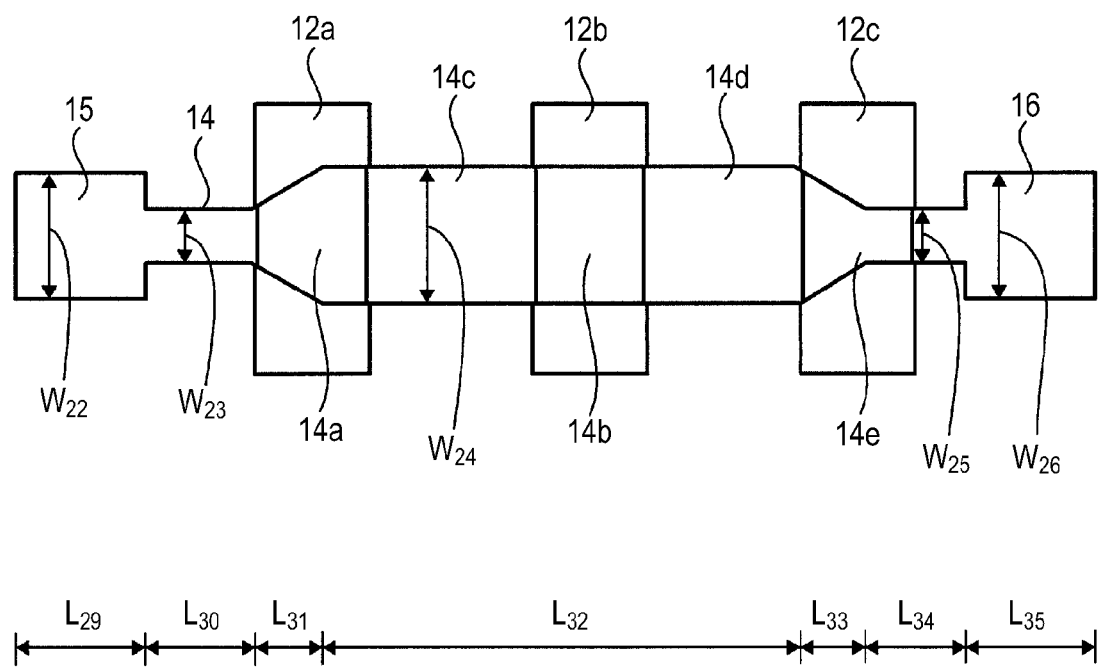
FIG. 6 is a plan view of a pixel driving thin film transistor part of a liquid crystal display device of a fourth embodiment.

This fourth embodiment is different from the first embodiment in that a thin film transistor T includes three thin film transistors electrically connected in series to each other. Specifically, as shown in FIG. 6, a semiconductor thin film 14 is provided to extend over three gate electrodes 12a, 12b 12c. Reference numeral 14d denotes an impurity doped region similar to an impurity doped region 14c. The width of the semiconductor thin film 14 is changed from an end on a source region 15 side in such a way that the width is $W_{22}$ in length $L_{29}$, $W_{23}$ smaller than $W_{22}$ in length $L_{30}$, linearly increases from $W_{23}$ to $W_{24}$ in length $L_{31}$, $W_{24}$ in length $L_{32}$, linearly decreases from $W_{24}$ to $W_{25}$ in length $L_{33}$, $W_{25}$ in length $L_{34}$, and $W_{26}$ larger than $W_{25}$ in length $L_{36}$. Particularly, in a channel part 14a substantially overlapping with the gate electrode 12a in the semiconductor thin film 14, the width of a portion on the source region 15 side linearly increases from $W_{23}$ to $W_{24}$, and the other portion has the constant width $W_{24}$. Besides, in a channel part 14b substantially overlapping with the gate electrode 12b in the semiconductor thin film 14, the semiconductor thin film 14 has the constant width $W_{24}$. Besides, in a channel part 14e substantially overlapping with the gate electrode 12c in the semiconductor thin film 14, the width of a portion on the source region 15 side linearly decreases from $W_{24}$ to $W_{25}$, and the other portion has the constant width $W_{25}$. The widths $W_{22}$ to $W_{26}$ and the lengths $L_{29}$ to $L_{35}$ are appropriately designed according to the performance required for the thin film transistor T. For example, when $W_{23}$, $W_{25}$ is 0.5 to 3.5 μm, $W_{24}$ is selected to be 3.5 to 10.5 μm. A typical example is that when $W_{23}$, $W_{25}$ is 2.0 μm, $W_{24}$ is 6.0 μm. The widths $W_{23}$ and $W_{25}$ may be difference from each other. Besides, for example, $W_{22}$ is selected to be 3.0 to 15.0 μm, and $W_{23}$ is selected to be 0.5 to 10.0 μm. A typical example is $W_{22}$=8.0 μm and $W_{23}$=2.0 μm.

The structure of this liquid crystal display device other than the above is the same as that of the liquid crystal display device of the first embodiment.

Besides, the manufacturing method of this liquid crystal display device is the same as the manufacturing method of the liquid crystal display device of the first embodiment.

According to the fourth embodiment, the same merits as those of the first embodiment can be obtained.

5. Fifth Embodiment

Liquid Crystal Display Device

Figure 7:
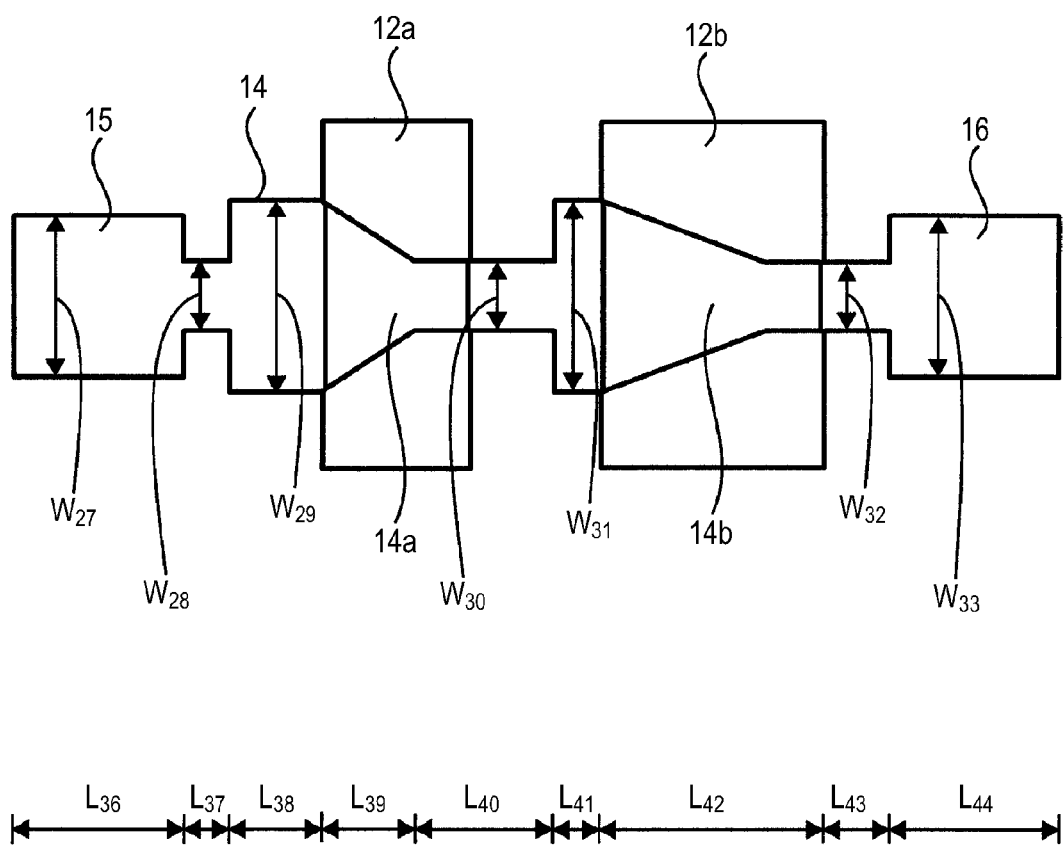
FIG. 7 is a plan view of a pixel driving thin film transistor part of a liquid crystal display device of a fifth embodiment.

In this fifth embodiment, widths of gate electrodes 12a and 12b of a thin film transistor T in a channel length direction are different from each other, and a pattern of a semiconductor thin film 14 is different from that of the first embodiment. That is, as shown in FIG. 7, in this case, the width of the gate electrode 12b in the channel length direction is larger than the width of the gate electrode 12a in the channel length direction. Besides, the width of the semiconductor thin film 14 is changed from an end on a source region 15 side in such a way that the width is $W_{27}$ in length $L_{36}$, $W_{28}$ smaller than $W_{27}$ in length $L_{37}$, $W_{29}$ larger than $W_{28}$ in length $L_{38}$, linearly decreases from $W_{29}$ to $W_{30}$ in length $L_{39}$, $W_{30}$ in length $L_{40}$, $W_{31}$ larger than $W_{30}$ in length $L_{41}$, linearly decreases from $W_{31}$ to $W_{32}$ in length $L_{42}$, $W_{32}$ in length $L_{43}$, and $W_{33}$ larger than $W_{32}$ in length $L_{44}$ to an end on a drain region 16 side. Particularly, in a channel part 14a substantially overlapping with the gate electrode 12a in the semiconductor thin film 14, the width linearly decreases from $W_{29}$ on the source region 15 side to $W_{30}$, and the other portion has the constant width $W_{30}$. Similarly, in a channel part 14b substantially overlapping with the gate electrode 12b in the semiconductor thin film 14, the width linearly decreases from $W_{31}$ on the source region 15 side to $W_{32}$, and the other portion has the constant width $W_{32}$. The widths $W_{27}$ to $W_{33}$ and the lengths $L_{36}$ to $L_{44}$ are appropriately designed according to the performance required for the thin film transistor T. For example, when $W_{30}$, $W_{32}$ is 0.5 to 3.5 μm, $W_{29}$, $W_{31}$ is selected to be 3.5 to 10.5 μm. A typical example is that when $W_{30}$, $W_{32}$ is 2.0 μm, $W_{29}$, $W_{31}$ is 6.0 μm. The widths $W_{30}$ and $W_{32}$ may be different from each other. The widths $W_{29}$ and $W_{31}$ may also be different from each other. Besides, for example, $W_{27}$ is selected to be 3.0 to 1.5 μm, and $W_{28}$ is selected to be 0.5 to 10.0 μm. A typical example is $W_{27}$=8.0 μm and $W_{28}$=2.0 μm.

The structure of this liquid crystal display device other than the above is the same as that of the liquid crystal display device of the first embodiment.

Besides, the manufacturing method of this liquid crystal display device is the same as the manufacturing method of the liquid crystal display device of the first embodiment.

According to the fifth embodiment, the same merits as those of the first embodiment can be obtained.

6. Sixth Embodiment

Liquid Crystal Display Device

In this sixth embodiment, widths of gate electrodes 12a and 12b of a thin film transistor T in a channel length direction are different from each other, and a pattern of a semiconductor thin film 14 is different from that of the first embodiment. That is, as shown in FIG. 8, in this case, the width of the gate electrode 12b in the channel length direction is larger than the width of the gate electrode 12a in the channel length direction. The width of the semiconductor thin film 14 is changed from an end on a source region 15 side in such a way that the width is $W_{34}$ in length $L_{45}$, $W_{35}$ smaller than $W_{34}$ in length $L_{46}$, linearly increases from $W_{35}$ to $W_{36}$ in length $L_{47}$, $W_{36}$ in length $L_{48}$, linearly decreases from $W_{36}$ to $W_{37}$ in length $L_{49}$, $W_{37}$ in length $L_{50}$, and $W_{38}$ larger than $W_{37}$ in length $L_{51}$ to an end on a drain region 16 side. Particularly, in a channel part 14a substantially overlapping with the gate electrode 12a in the semiconductor thin film 14, a portion on the source region 15 side has the constant width $W_{35}$, and the width of the other portion linearly increases from $W_{35}$ to $W_{36}$. Besides, in a channel part 14b substantially overlapping with the gate electrode 12b in the semiconductor thin film 14, a portion on the source region 15 side has the constant width $W_{36}$, the width of a portion adjacent thereto linearly decreases from $W_{36}$ to $W_{37}$, and the other portion has the constant width $W_{37}$. The widths $W_{34}$ to $W_{38}$ and the lengths $L_{45}$ to $L_{51}$ are appropriately designed according to the performance required for the thin film transistor T. For example, when $W_{35}$, $W_{37}$ is 0.5 to 3.5 μm, $W_{36}$ is selected to be 3.5 to 10.5 μm. A typical example is that when $W_{35}$, $W_{37}$ is 2.0 μm, $W_{36}$ is 6.0 μm. The widths $W_{35}$ and $W_{37}$ may be different from each other. Besides, for example, $W_{34}$ is selected to be 3.0 to 15.0 μm, and $W_{35}$ is selected to be 0.5 to 10.0 μm. A typical example is $W_{34}$=8.0 μm and $W_{35}$=2.0 μm.

The structure of this liquid crystal display device other than the above is the same as that of the liquid crystal display device of the first embodiment.

Besides, the manufacturing method of this liquid crystal display device is the same as the manufacturing method of the liquid crystal display device of the first embodiment.

According to the sixth embodiment, the same merits as those of the first embodiment can be obtained.

7. Seventh Embodiment

Liquid Crystal Display Device

Figure 9:
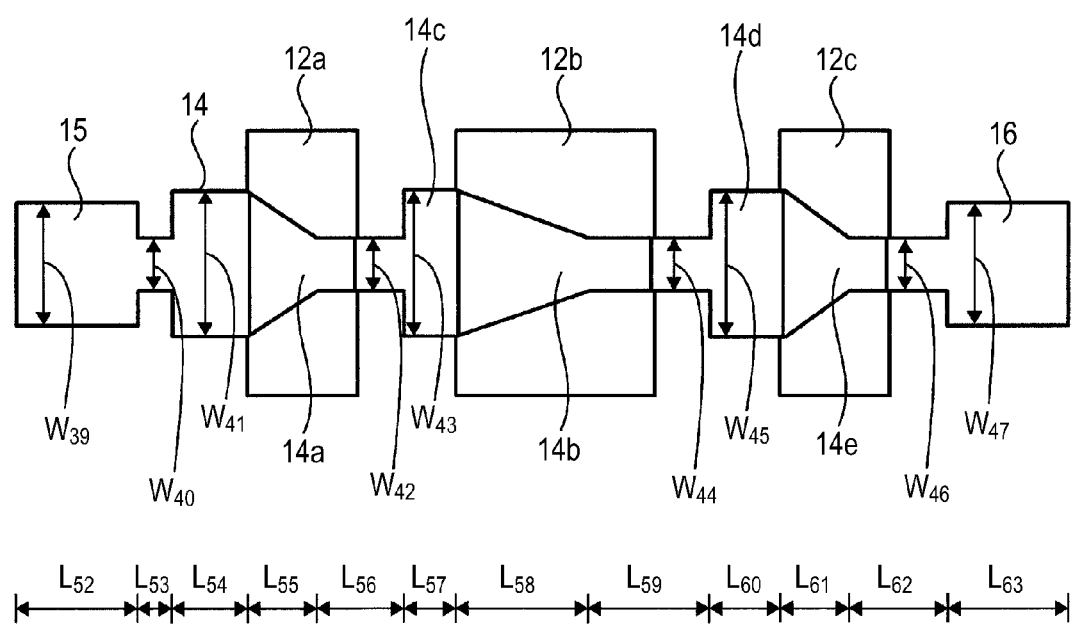
FIG. 9 is a plan view of a pixel driving thin film transistor part of a liquid crystal display device of a seventh embodiment.

In this seventh embodiment, a thin film transistor T includes three thin film transistors electrically connected in series to each other, widths of gate electrodes 12a and 12c of the thin film transistor T in a channel length direction are different from the width of a gate electrode 12b, and a pattern of a semiconductor thin film 14 is different from that of the first embodiment. That is, as shown in FIG. 9, in this case, the width of the gate electrode 12b in the channel length is larger than the widths of the gate electrodes 12a and 12c in the channel length direction. The semiconductor thin film 14 is provided to extend over the three gate electrodes 12a, 12b and 12c. Reference numeral 14d denotes an impurity doped region similar to an impurity doped region 14c. The width of the semiconductor thin film 14 is changed from an end on a source region 15 side in such a way that the width is $W_{39}$ in length $L_{52}$, $W_{40}$ smaller than $W_{39}$ in length $L_{53}$, $W_{41}$ larger than $W_{40}$ in length $L_{54}$, linearly decreases from $W_{41}$ to $W_{42}$ in length $L_{55}$, $W_{42}$ in length $L_{56}$, $W_{43}$ larger than $W_{42}$ in length $L_{57}$, linearly decreases from $W_{43}$ to $W_{44}$ in length $L_{58}$, $W_{44}$ in length $L_{59}$, $W_{45}$ larger than $W_{44}$ in length $L_{60}$, linearly decreases from $W_{45}$ to $W_{46}$ in length $L_{61}$, $W_{46}$ in length $L_{62}$, and $W_{47}$ larger than $W_{46}$ in length $L_{63}$. Especially, in a channel part 14a substantially overlapping with the gate electrode 12a in the semiconductor thin film 14, a portion on the source region 15 side linearly decreases from $W_{41}$ to $W_{42}$, and the other portion has the constant width $W_{42}$. Besides, in a channel part 14b substantially overlapping with the gate electrode 12b in the semiconductor thin film 14, a portion on the source region 15 side linearly decreases from $W_{43}$ to $W_{44}$, and the other portion has the constant width $W_{44}$. In a channel part 14e substantially overlapping with the gate electrode 12c of the semiconductor thin film 14, the width of a portion on the source region 15 side linearly decrease from $W_{45}$ to $W_{46}$, and the other portion has the constant width $W_{46}$. The widths $W_{39}$ to $W_{47}$ and the lengths $L_{52}$ to $L_{63}$ are appropriately designed according to the performance required for the thin film transistor T. For example, when $W_{42}$, $W_{44}$, $W_{46}$ is 0.5 to 3.5 μm, $W_{41}$, $W_{43}$, $W_{45}$ is selected to be 3.5 to 10.5 μm. A typical example is that when $W_{42}$, $W_{44}$, $W_{46}$ is 2.0 μm, $W_{41}$, $W_{43}$, $W_{45}$ is 6.0 μm. The widths $W_{42}$, $W_{44}$ and $W_{46}$ may be different from each other. Besides, the widths $W_{41}$, $W_{43}$ and $W_{45}$ may also be different from each other. Besides, for example, $W_{39}$ is selected to be 3.0 to 15.0 μm, and $W_{40}$ is selected to be 0.5 to 10.0 μm. A typical example is $W_{39}$=8.0 μm and $W_{40}$=2.0 μm.

The structure of this liquid crystal display device other than the above is the same as that of the liquid crystal display device of the first embodiment.

Besides, the manufacturing method of this liquid crystal display device is the same as the manufacturing method of the liquid crystal display device of the first embodiment.

According to the seventh embodiment, the same merits as those of the first embodiment can be obtained.

8. Eighth Embodiment

Liquid Crystal Display Device

This eighth embodiment is different from the first embodiment in that a thin film transistor T includes one thin film transistor. That is, as shown in FIG. 10, a semiconductor thin film 14 is provided to extend over one gate electrode 12a. The width of the semiconductor thin film 14 is changed from an end on a source region 15 side in such a way that the width is $W_{48}$ in length $L_{64}$, $W_{49}$ smaller than $W_{48}$ in length $L_{65}$, $W_{50}$ larger than $W_{49}$ in length $L_{66}$, linearly decreases from $W_{50}$ to $W_{51}$ in length $L_{67}$, $W_{51}$ in length $L_{68}$, and $W_{52}$ larger than $W_{51}$ in length $L_{69}$. Particularly, in a channel part 14a substantially overlapping with the gate electrode 12a in the semiconductor thin film 14, the width of a portion on the source region 15 side linearly decreases from $W_{50}$ to $W_{51}$, and the other portion has the constant width $W_{51}$. The widths $W_{48}$ to $W_{52}$ and the lengths $L_{64}$ to $L_{69}$ are appropriately designed according to the performance required for the thin film transistor T. For example, when $W_{51}$ is 0.5 to 3.5 µm, $W_{50}$ is selected to be 3.5 to 10.5 µm. A typical example is that when $W_{51}$ is 2.0 µm, $W_{50}$ is 6.0 µm. Besides, for example, $W_{48}$ is selected to be 3.0 to 15.0 µm, and $W_{49}$ is selected to be 0.5 to 10.0 µm. A typical example is $W_{48}$=8.0 µm and $W_{49}$=2.0 µm.

The structure of this liquid crystal display device other than the above is the same as that of the liquid crystal display device of the first embodiment.

Besides, the manufacturing method of this liquid crystal display device is the same as the manufacturing method of the liquid crystal display device of the first embodiment.

According to the eighth embodiment, the same merits as those of the first embodiment can be obtained.

9. Ninth Embodiment

Liquid Crystal Display Device

This ninth embodiment is different from the first embodiment in that a thin film transistor T includes one thin film transistor. That is, as shown in FIG. 11, a semiconductor thin film 14 is provided to extend over one gate electrode 12a. The width of the semiconductor thin film 14 is changed from an end on a source region 15 side in such a way that the width is $W_{53}$ in length $L_{70}$, $W_{54}$ smaller than $W_{53}$ in length $L_{71}$, $W_{55}$ larger than $W_{54}$ in length $L_{72}$, linearly decreases from $W_{55}$ to $W_{56}$ in length $L_{73}$, $W_{56}$ in length $L_{74}$, and $W_{57}$ larger than $W_{56}$ in length $L_{75}$. Particularly, in a channel part 14a substantially overlapping with the gate electrode 12a in the semiconductor thin film 14, the width of a portion on the source region 15 side linearly decreases from $W_{55}$ to $W_{56}$. The widths $W_{53}$ to $W_{57}$ and the lengths $L_{70}$ to $L_{75}$ are appropriately designed according to the performance required for the thin film transistor T. For example, when $W_{56}$ is 0.5 to 3.5 µm, $W_{55}$ is selected to be 3.5 to 10.5 µm. A typical example is that when $W_{56}$ is 2.0 µm, $W_{55}$ is 6.0 µm. Besides, for example, $W_{53}$ is selected to be 3.0 to 15.0 µm, and $W_{54}$ is selected to be 0.5 to 10.0 µm. A typical example is $W_{53}$=8.0 µm and $W_{54}$=2.0 µm.

The structure of this liquid crystal display device other than the above is the same as that of the liquid crystal display device of the first embodiment.

Besides, the manufacturing method of the liquid crystal display device is the same as the manufacturing method of the liquid crystal display device of the first embodiment.

According to the ninth embodiment, the same merits as those of the first embodiment can be obtained.

10. Tenth Embodiment

Liquid Crystal Display Device

Figure 12:
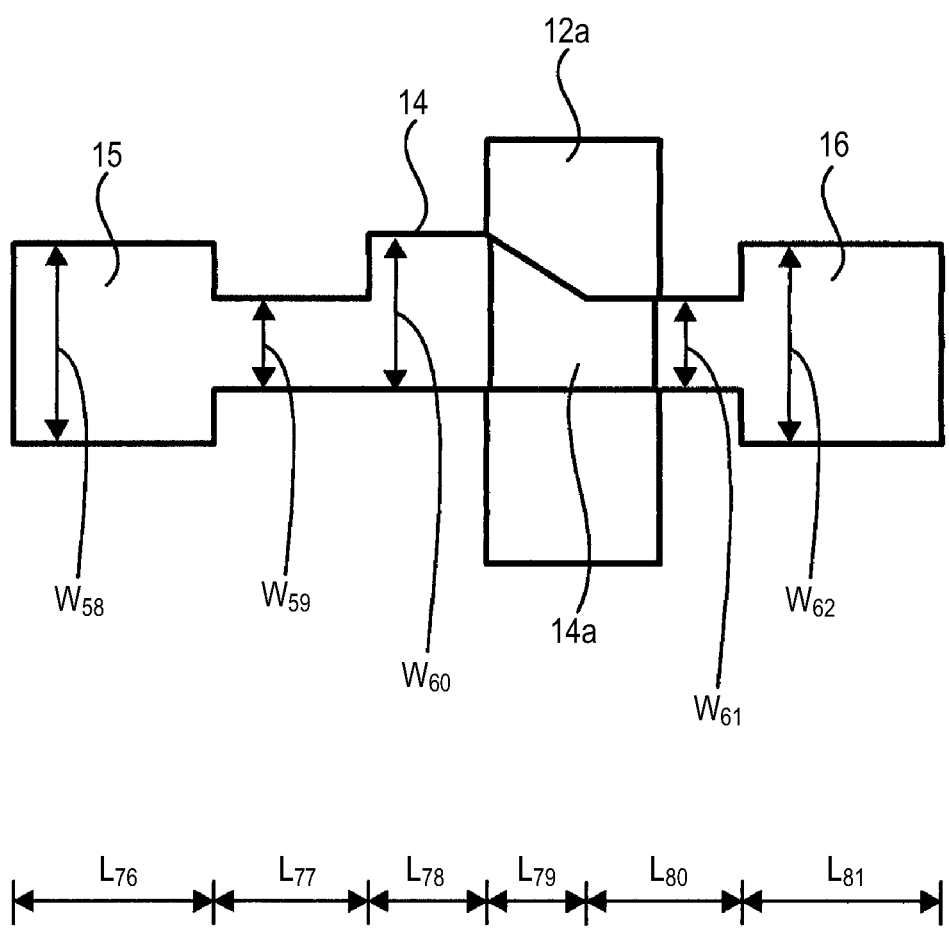
FIG. 12 is a plan view of a pixel driving thin film transistor part of a liquid crystal display device of a tenth embodiment.

This tenth embodiment is different from the first embodiment in that a thin film transistor T includes one thin film transistor. That is, as shown in FIG. 12, a semiconductor thin film 14 is provided to extend over one gate electrode 12a. The width of the semiconductor thin film 14 is changed from an end on a source region 15 side in such a way that the width is $W_{58}$ in length $L_{76}$, $W_{59}$ smaller than $W_{58}$ in length $L_{77}$, $W_{60}$ larger than $W_{59}$ in length $L_{78}$, linearly decreases from $W_{60}$ to $W_{61}$ in length $L_{79}$, $W_{61}$ in length $L_{80}$, and $W_{62}$ larger than $W_{61}$ in length $L_{81}$. Particularly, in a channel part 14a substantially overlapping with the gate electrode 12a in the semiconductor thin film 14, the width of a portion on the source region 15 side linearly decreases from $W_{60}$ to $W_{61}$, and the other portion has the constant width $W_{61}$. Besides, in this case, one side of each of the portions of the lengths $L_{77}+L_{78}+L_{79}+L_{80}$ in the semiconductor thin film 14 is parallel to the channel length direction. The widths $W_{58}$ to $W_{62}$ and $L_{76}$ to $L_{81}$ are appropriately designed according to the performance required for the thin film transistor T. For example, when $W_{61}$ is 0.5 to 3.5 µm, $W_{60}$ is selected to be 3.5 to 10.5 µm. A typical example is that when $W_{61}$ is 2.0 µm, $W_{60}$ is 6.0 µm. Besides, for example, $W_{58}$ is selected to be 3.0 to 15.0 µm, and $W_{59}$ is selected to be 0.5 to 10.0 µm. A typical example is $W_{58}$=8.0 µm and $W_{59}$=2.0 µm.

The structure of this liquid crystal display device other than the above is the same as that of the liquid crystal display device of the first embodiment.

Besides, the manufacturing method of this liquid crystal display device is the same as manufacturing method of the liquid crystal display device of the first embodiment.

According to the tenth embodiment, the same merits as those of the first embodiment can be obtained.

11. Eleventh Embodiment

Liquid Crystal Display Device

Figure 13:
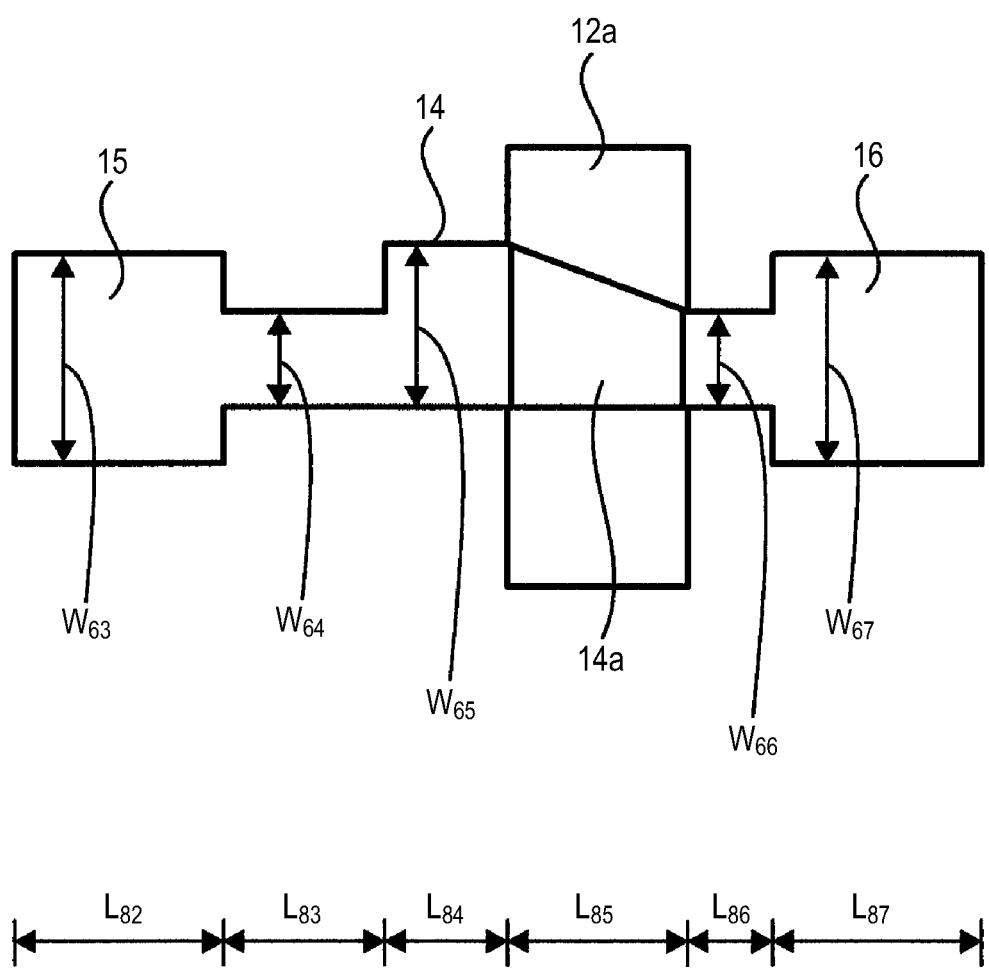
FIG. 13 is a plan view of a pixel driving thin film transistor part of a liquid crystal display device of an eleventh embodiment.

This eleventh embodiment is different from the first embodiment in that a thin film transistor T includes one thin film transistor. That is, as shown in FIG. 13, a semiconductor thin film 14 is provided to extend over one gate electrode 12a. The width of the semiconductor thin film 14 is changed from an end on a source region 15 side in such a way that the width is $W_{63}$ in length $L_{82}$, $W_{64}$ smaller than $W_{63}$ in length $L_{83}$, $W_{65}$ larger than $W_{64}$ in length $L_{84}$, linearly decreases from $W_{65}$ to $W_{66}$ in length $L_{85}$, $W_{66}$ in length $L_{86}$, and $W_{67}$ larger than $W_{66}$ in length $L_{87}$. Particularly, in a channel part 14a substantially overlapping with the gate electrode 12a in the semiconductor thin film 14, the width of a portion on the source region 15 side linearly decreases from $W_{65}$ to $W_{66}$. Besides, in this case, one side of each of the portions of the lengths $L_{83}+L_{84}+L_{85}+L_{86}$ in the semiconductor thin film 14 is parallel to the channel length direction. The widths $W_{63}$ to $W_{67}$ and the lengths $L_{82}$ to $L_{87}$ are appropriately designed according to the performance required for the thin film transistor T. For example, when $W_{66}$ is 0.5 to 3.5 µm, $W_{65}$ is selected to be 3.5 to 10.5 µm. A typical example is that when $W_{66}$ is 2.0 µm, $W_{65}$ is 6.0 µm. Besides, for example, $W_{63}$ is selected to be 3.0 to 15.0 µm, $W_{64}$ is selected to be 0.5 to 10.0 µm. A typical example is $W_{63}$=8.0 µm and $W_{64}$=2.0 µm.

The structure of this liquid crystal display device other than the above is the same as that of the liquid crystal display device of the first embodiment.

Besides, the manufacturing method of this liquid crystal display device is the same as the manufacturing method of the liquid crystal display device of the first embodiment.

According to the eleventh embodiment, the same merits as those of the first embodiment can be obtained.

12. Twelfth Embodiment

Liquid Crystal Display Device

This twelfth embodiment is different from the first embodiment in that a thin film transistor T includes one thin film transistor. That is, as shown in FIG. 14, a semiconductor thin film 14 is provided to extend over one gate electrode 12a. The width of the semiconductor thin film 14 is changed from an end on a source region 15 side in such a way that the width is $W_{68}$ in length $L_{88}$, $W_{69}$ smaller than $W_{68}$ in length $L_{89}$, linearly increases from $W_{69}$ to $W_{70}$ in length $L_{90}$, $W_{70}$ in length $L_{91}$, linearly decreases from $W_{70}$ to $W_{71}$ in length $L_{92}$, $W_{71}$ in length $L_{93}$, and $W_{72}$ larger than $W_{71}$ in length $L_{94}$. Especially, in a channel part 14a substantially overlapping with the gate electrode 12a in the semiconductor thin film 14, a portion on the source region 15 side has the constant width $W_{69}$, the width of a portion adjacent thereto linearly increases from $W_{69}$ to $W_{70}$, the center part has the constant width $W_{70}$, the width of a portion adjacent thereto linearly decreases from $W_{70}$ to $W_{71}$, and a portion on a drain region 16 side has the constant width $W_{71}$. The widths $W_{68}$ to $W_{72}$ and the lengths $L_{88}$ to $L_{94}$ are appropriately designed according to the performance required for the thin film transistor T. For example, when $W_{69}$, $W_{71}$ is 0.5 to 3.5 μm, $W_{70}$ is selected to be 3.5 to 10.5 μm. A typical example is that when $W_{69}$, $W_{71}$ is 2.0 μm, $W_{70}$ is 6.0 μm. Besides, for example, $W_{68}$ is selected to be 3.0 to 15.0 μm, and $W_{69}$ is selected to be 0.5 to 10.0 μm. A typical example is $W_{68}$=8.0 μm and $W_{69}$=2.0 μm.

The structure of this liquid crystal display device other than the above is the same as that of the liquid crystal display device of the first embodiment.

Besides, the manufacturing method of this liquid crystal display device is the same as the manufacturing method of the liquid crystal display device of the first embodiment.

According to the twelfth embodiment, the same merits as those of the first embodiment can be obtained.

13. Thirteenth Embodiment

Liquid Crystal Display Device

Figure 15:
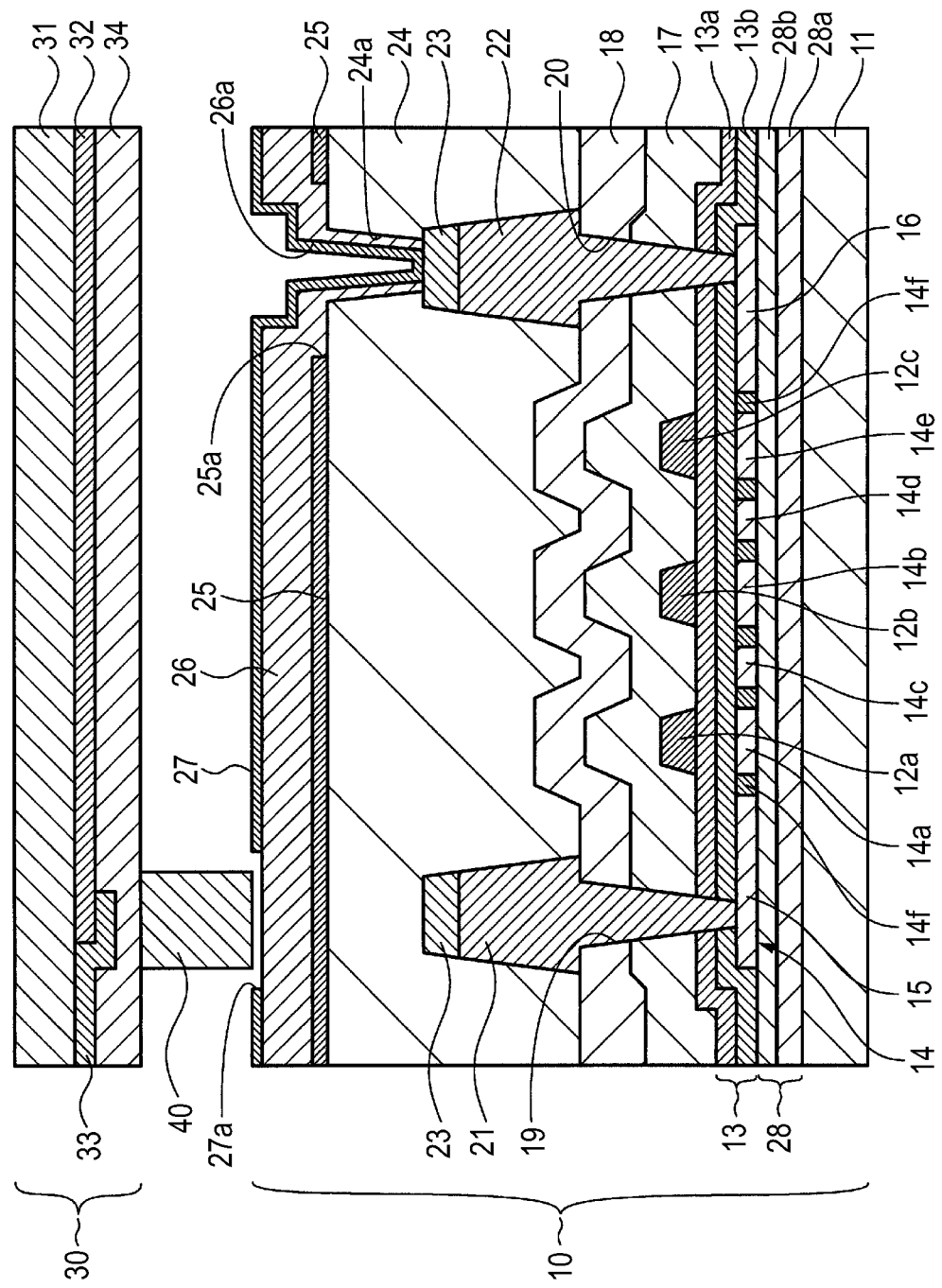
FIG. 15 is a section view showing a liquid crystal display device of a thirteenth embodiment.
Figure 16:
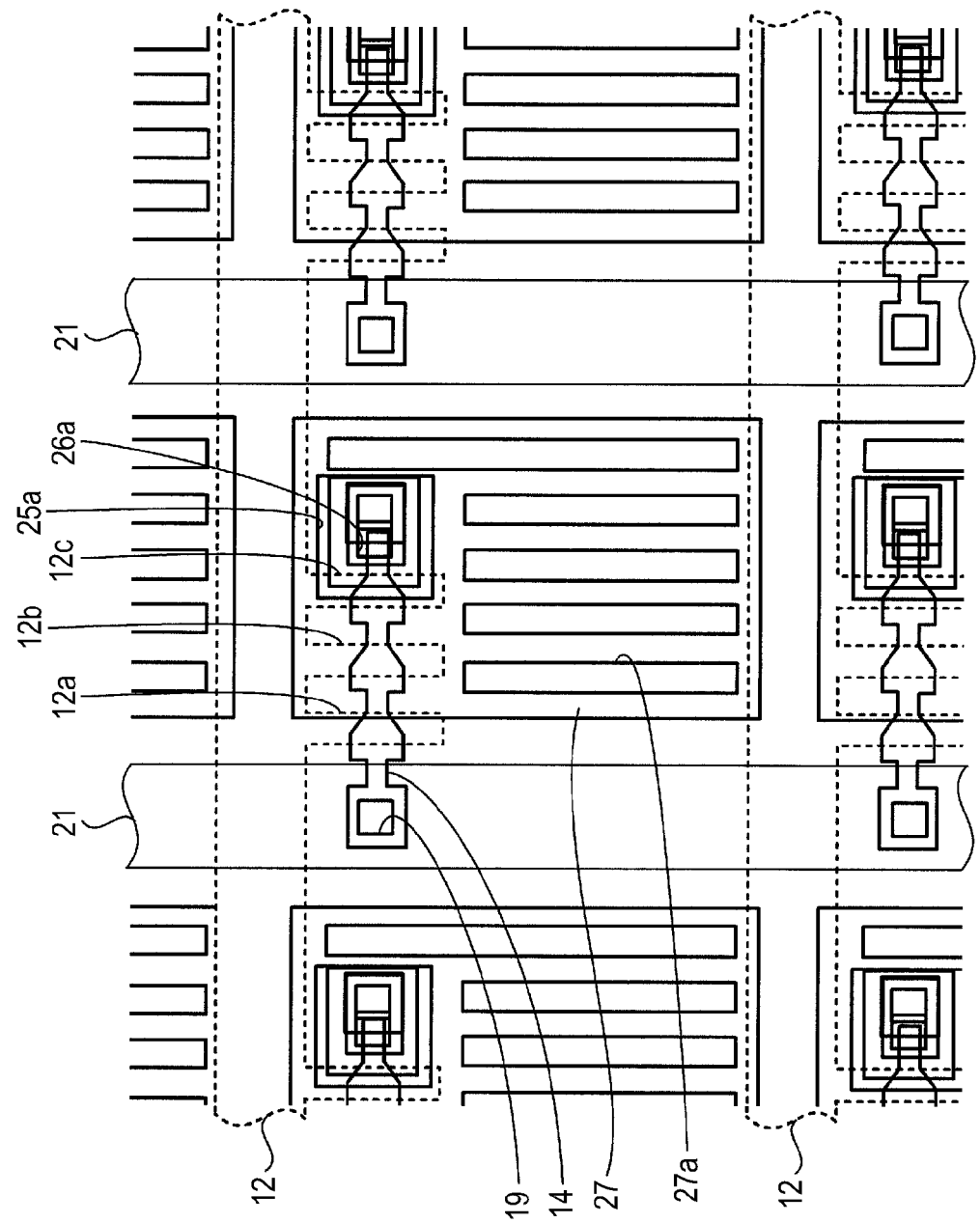
FIG. 16 is a plan view showing the liquid crystal display device of the thirteenth embodiment.
Figure 17:
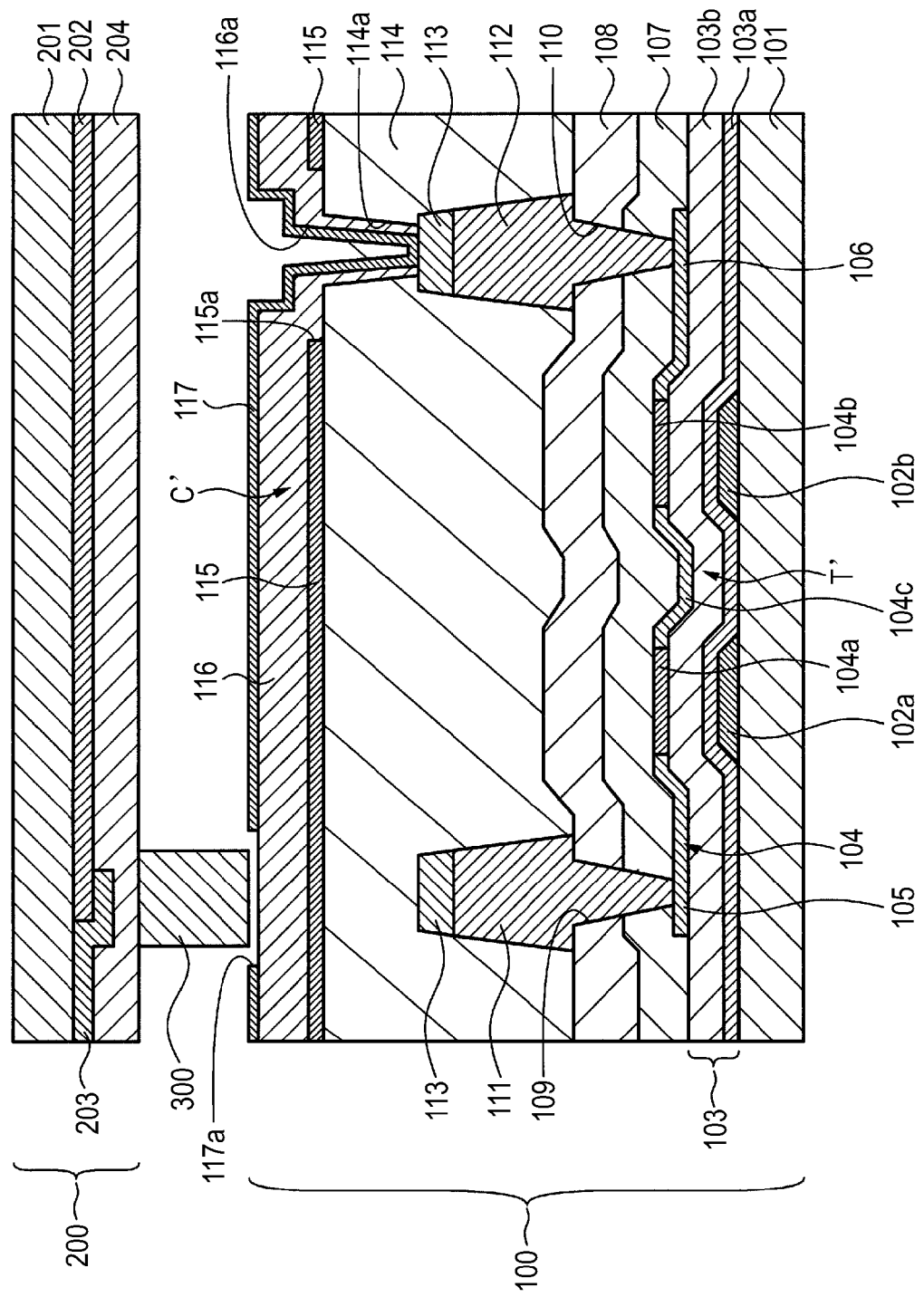
FIG. 17 is a sectional view showing a related art liquid crystal display device.
Figure 18:
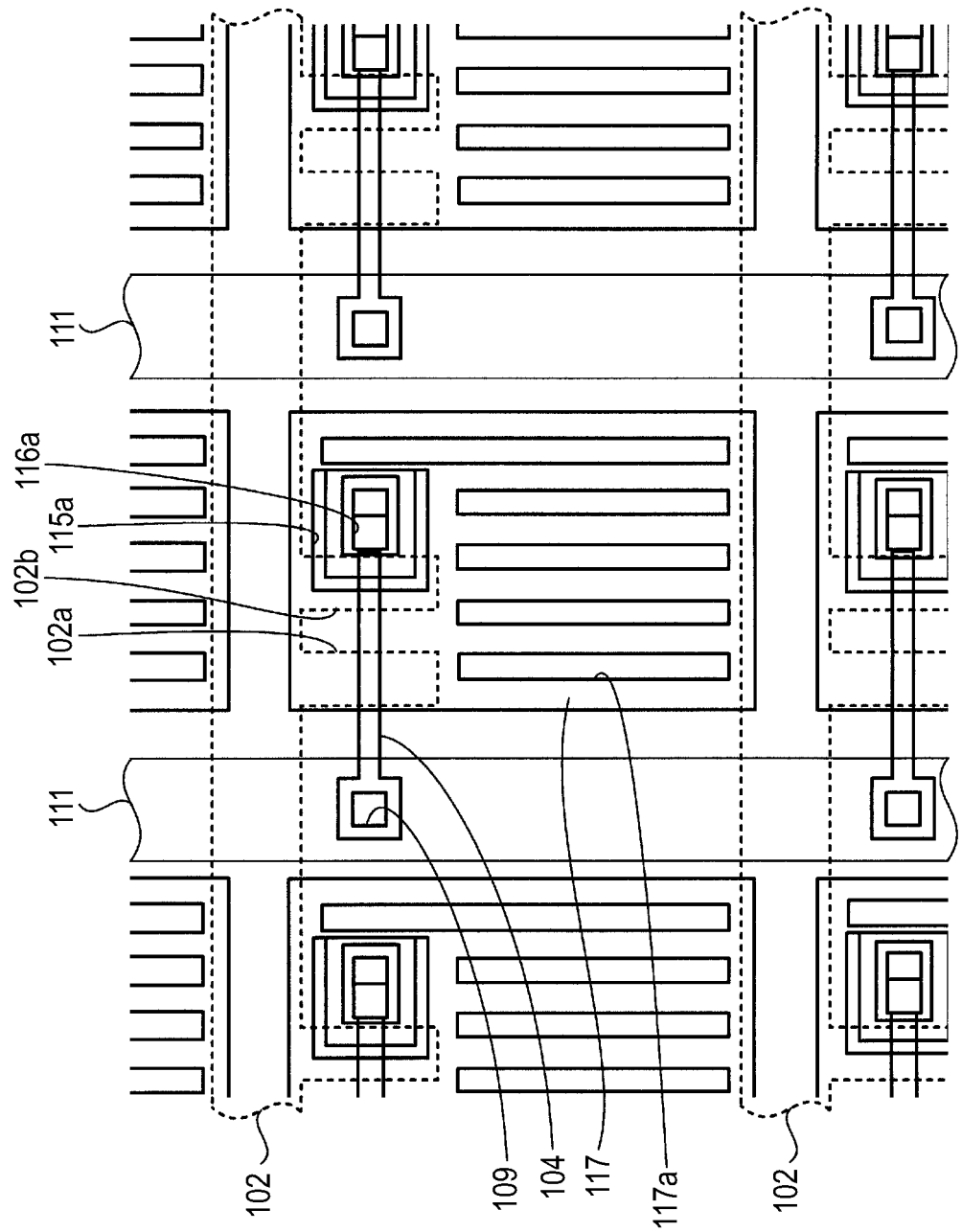
FIG. 18 is a plan view showing the related art liquid crystal display device.
Figure 19:
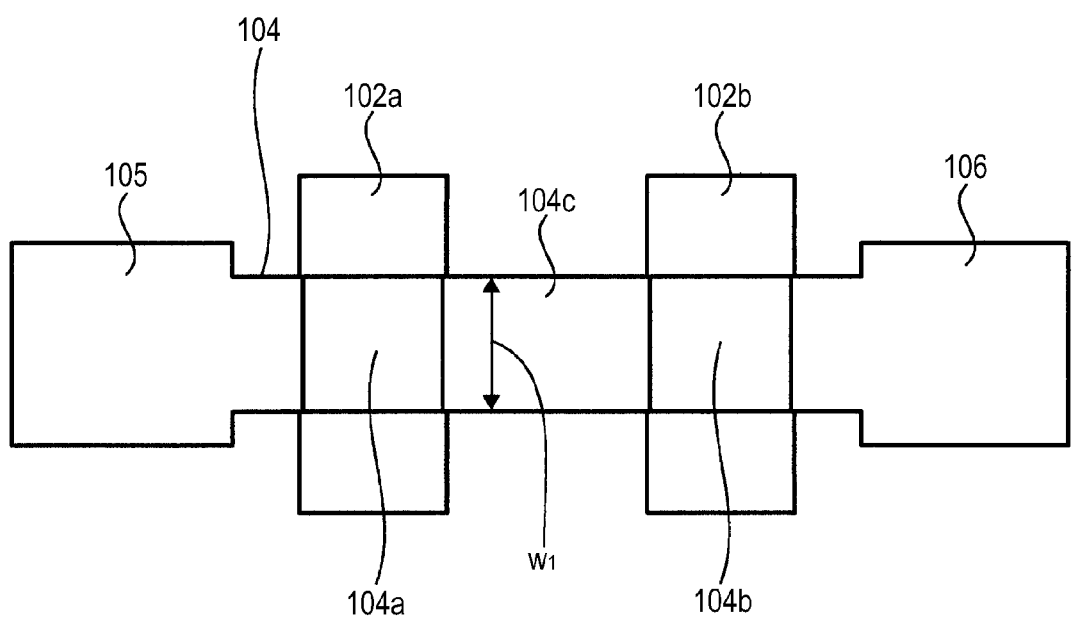
FIG. 19 is a plan view of a pixel driving thin film transistor part of the related art thin film transistor shown in FIG. 17 and FIG. 18.
Figure 20:
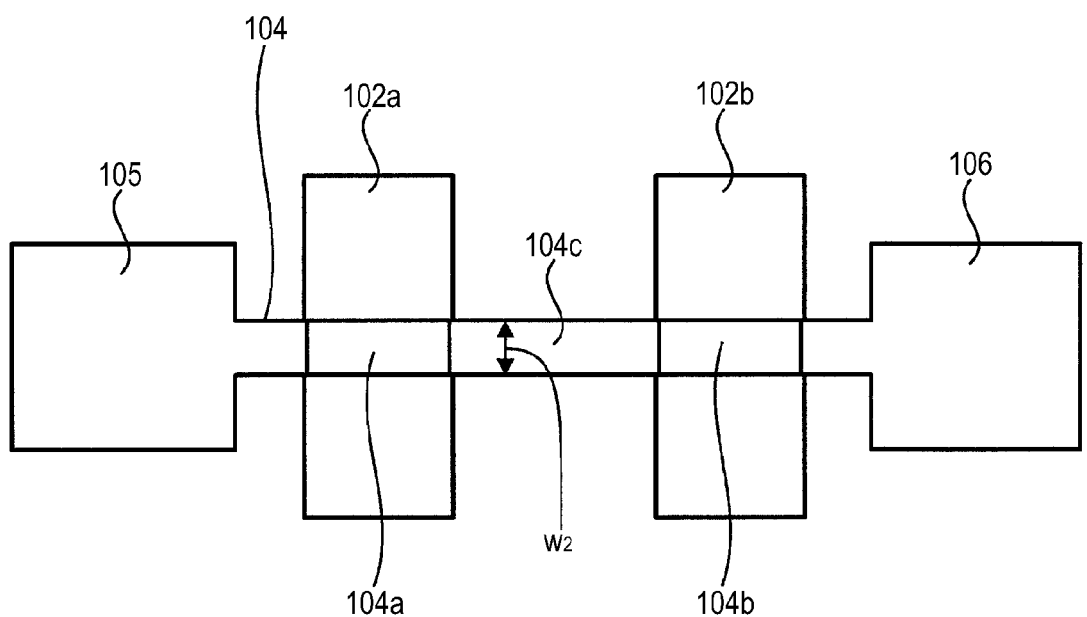
FIG. 20 is a plan view of a pixel driving thin film transistor part of the related art thin film transistor shown in FIG. 17 and FIG. 18.

FIG. 15 and FIG. 16 show a liquid crystal display device of a thirteenth embodiment. The liquid crystal display device is an active matrix driving liquid crystal display device of IPS mode or FFS mode. Here, FIG. 15 is a sectional view of the liquid crystal display device, and FIG. 16 is a plan view of the liquid crystal display device.

As shown in FIG. 15 and FIG. 16, in this liquid crystal display device, a TFT substrate 10 and an opposite substrate 30 are provided to be opposite to each other through a liquid crystal (not shown) therebetween, and the distance between them is regulated by a spacer 40 provided on the opposite substrate 30.

In the TFT substrate 10, a passivation film 28 including, for example, a SiN film 28a and a SiO$_2$ film 28b is provided on a transparent substrate 11 such as a transparent glass substrate. A semiconductor thin film 14 having a specified shape is provided on the passivation film 28. Although the semiconductor thin film 14 is typically a silicon thin film, for example, a polycrystalline silicon thin film or an amorphous silicon thin film, no limitation is made to this. A gate insulating film 13 is provided on the semiconductor thin film 14. The gate insulating film 13 includes two layers of a lower insulating film 13a and an upper insulating film 13a. For example, a SiN film is used as the upper insulating film 13a, and for example, a SiO$_2$ film is used as the lower insulating film 13b. However, no limitation is made to this. A gate wiring line 12 and gate electrodes 12a, 12b and 12c are provided on the gate insulating film 13. Although the gate wiring line 12 and the gate electrodes 12a, 12b and 12c are made of metal such as Cr, Al, Mo, Ta, W or Ti, no limitation is made to this. The semiconductor thin film 14 is doped with impurity except for channel parts 14a, 14b and 14e below the gate electrodes 12a, 12b and 12c. An impurity doped region on one end side of the semiconductor thin film 14 forms a source region 15, and an impurity doped region on the other end side forms a drain region 16. Reference numerals 14c and 14d denote impurity doped regions. Low impurity concentration regions 14f are formed in the source region 15, the impurity doped regions 14c and 14d, and the drain region 16 below the side walls of the gate electrodes 12a, 12b and 12c. A thin film transistor T of a switching circuit for driving pixels, which has a structure in which three thin film transistors are electrically connected in series to each other, includes the gate electrodes 12a, 12b and 12c, the gate insulating film 13, and the semiconductor thin film 14 in which the source region 15, the drain region 16, and the channel parts 14a, 14b and 14c are formed. The thin film transistor T has the same structure as that of the thin film transistor T of the liquid crystal display device of the third embodiment, and has a plane shape substantially as shown in FIG. 5. The thin film transistor T has a top gate structure in which the gate electrodes 12a, 12b and 12c are provided on the upper side of the semiconductor thin film 14. Besides, the thin film transistor T has a LDD (Lightly doped drain) structure in which the low impurity concentration regions 14f are formed in the source region 15, the impurity doped regions 14c and 14d, and the drain region 16 below the side walls of the gate electrodes 12a, 12b and 12c. When the thin film transistor T is of an n-channel type, an n-type impurity such as, for example, P or As is used as the impurity of the source region 15 and the drain region 16. In general, As is used as the n-type impurity for formation of the source region 15, the impurity doped regions 14c and 14d and the drain region 16, and P is used as the n-type impurity for formation of the low impurity concentration region 14f. Besides, when the thin film transistor T is of a p-channel type, a p-type impurity such as, for example, B is used as the impurity of the source region 15 and the drain region 16.

Interlayer insulating films 17 and 18 are provided so as to cover the gate wiring line 12 and the gate electrodes 12a, 12b and 12c. For example, a SiN film is used as the interlayer insulating film 17, and for example, a SiO$_2$ film is used as the interlayer insulating film 18. However, no limitation is made to this. A contact hole 19 is provided in portions of the gate insulating film and the interlayer insulating films 17 and 18 above the source region 15. Besides, a contact hole 20 is provided in portions of the gate insulating film 13 and the interlayer insulating films 17 and 18 above the drain region 16. A data line 21 contacts the source region 15 through the contact hole 19. Besides, a lead electrode 22 contacts the drain region 16 through the contact hole 20.

The structure of this liquid crystal display device other than the above is the same as that of the liquid crystal display device of the first embodiment.

Next, a manufacturing method of this liquid crystal display device will be described.

First, as shown in FIG. 15 and FIG. 16, the passivation film 28 is formed by sequentially forming, for example, the SiN film 28a and the SiO$_2$ film 28b by, for example, a plasma CVD method on the transparent substrate 11 such as, for example, the transparent glass substrate. Next, an amorphous silicon thin film is formed on the passivation film 28 by, for example, a plasma CVD method. Next, the amorphous silicon thin film is crystallized by laser annealing using an excimer laser or a semiconductor laser or by lamp annealing. In this way, the semiconductor thin film 14 made of the polycrystalline silicon thin film is formed. Next, the semiconductor thin film 14 is patterned into the shape shown in FIG. 5 by photolithography and etching. Next, the gate insulating film 13 is formed by sequentially forming the insulating film 13b such as the $SiO_2$ film and the insulating film 13a such as the SiN film on the entire surface by, for example, a plasma CVD method so as to cover the semiconductor thin film 14. Next, a metal film made of metal such as Cr, Al, Mo, Ta, W or Ti is formed on the entire surface by, for example, a sputtering method. Next, the metal film is patterned into a specified shape by photolithography and etching, and the gate wiring line 12 and the gate electrodes 12a, 12b and 12c are formed. Next, similarly to a manufacturing method of a transistor of a well-known LDD structure, the source region 15, the impurity doped regions 14c and 14d, the drain region 16 and the low impurity concentration region 14g are formed in the semiconductor thin film 14 by ion implantation or the like.

Next, the interlayer insulating films 17 and 18 are sequentially formed on the entire surface by, for example, a plasma CVD method so as to cover the gate wiring line 12 and the gate electrodes 12a, 12b and 12c. Next, the contact holes 19 and 20 are formed by etching and removing the specified portions of the gate insulating film 13 and the interlayer insulating films 17 and 18 by photolithography and etching. Next, a metal film and a barrier metal film made of metal such as Cr, Al, Mo, Ta, W or Ti are sequentially formed on the entire surface by, for example, a sputtering method. Next, the metal film and the barrier metal film are patterned by photolithography and etching, and the data line 21 and the lead line 22, which have barrier metal films 23 at the uppermost parts, are formed.

Thereafter, the process is advanced similarly to the manufacturing method of the liquid crystal display device of the first embodiment and the objective liquid crystal display device is manufactured.

According to the thirteenth embodiment, the same merits as those of the first embodiment can be obtained.

Although an embodiment are described specifically, the application is not limited to the foregoing embodiments, but can be variously modified based on the technical concept of the application.

For example, the numerical values, structures, substrates, processes and the like of the foregoing embodiments are merely examples, and numerical values, structures, substrates, processes and the like different form those may be used as the need arises.

Besides, for example, two or more of the first to the thirteenth embodiments may be combined as the need arises.

It should be understood that various changes and modifications to the presently preferred embodiments described herein will be apparent to those skilled in the art. Such changes and modifications can be made without departing from the spirit and scope and without diminishing its intended advantages. It is therefore intended that such changes and modifications be covered by the appended claims.

The application is claimed as follows:

1. A thin film transistor comprising:
   a semiconductor layer including a source region, a drain region, and at least two channel regions provided between the source region and the drain region; and
   at least two gate electrodes overlapping with the channel regions, for applying gate voltage to the at least two channel regions,
   wherein the channel regions include a first portion whose width continuously linearly changes along a lengthwise direction from the source region to the drain region, and a second portion whose width is constant,
   wherein the first portion and the second portion are linearly connected in a direction from the source region to the drain region, and
   wherein the semiconductor layer between the at least two channel regions has at least two portions each having a different width.

2. The thin film transistor of claim 1, wherein the channel width includes a source channel width portion directed to the source region and a drain channel width portion directed to the drain region, and wherein the source channel width portion is greater in size as compared to the drain channel width portion.

3. The thin film transistor of claim 1, wherein the channel width includes a source channel width portion directed to the source region and a drain channel width portion directed to the drain region, and wherein the source channel width portion is lesser in size as compared to the drain channel width portion.

4. The thin film transistor of claim 1, wherein the channel width includes a source channel width portion directed to the source region and a drain channel width portion directed to the drain region, and wherein the source channel width portion and the drain channel width portion are equal in size.

* * * * *